United States Patent
Kato et al.

(10) Patent No.: US 8,216,749 B2
(45) Date of Patent: Jul. 10, 2012

(54) CURABLE COMPOSITION, NEGATIVE TYPE COLOR FILTER AND METHOD OF PRODUCING THE SAME

(75) Inventors: Yasuhiro Kato, Minami-Ashigara (JP); Yuki Mizukawa, Minami-Ashigara (JP); Toshiki Fujiwara, Minami-Ashigara (JP); Yasuhiro Shimada, Minami-Ashigara (JP); Nobuo Suzuki, Haibara-gun (JP); Nobuo Seto, Minami-Ashigara (JP)

(73) Assignee: FUJIFILM Corporation, Tokyo (JP)

( * ) Notice: Subject to any disclaimer, the term of this patent is extended or adjusted under 35 U.S.C. 154(b) by 70 days.

(21) Appl. No.: 12/329,845

(22) Filed: Dec. 8, 2008

(65) Prior Publication Data

US 2009/0092802 A1    Apr. 9, 2009

Related U.S. Application Data

(62) Division of application No. 10/920,253, filed on Aug. 18, 2004, now abandoned.

(30) Foreign Application Priority Data

Aug. 20, 2003 (JP) .................. 2003-208090
Mar. 15, 2004 (JP) .................. 2004-073070

(51) Int. Cl.
    *G02F 5/20*    (2006.01)
(52) U.S. Cl. .......................................................... 430/7
(58) Field of Classification Search .................... None
    See application file for complete search history.

(56) References Cited

U.S. PATENT DOCUMENTS

| 5,639,579 A * | 6/1997 | Hayashi et al. ............ 430/7 |
| 7,256,222 B2 | 8/2007 | Ishizuka et al. |
| 2002/0103316 A1* | 8/2002 | Tanaka et al. ............ 526/245 |

FOREIGN PATENT DOCUMENTS

| DE | 2513949 A1 | 10/1976 |
| DE | 2525505 A1 | 12/1976 |
| DE | 2832020 A1 | 1/1980 |
| EP | 23309 A1 | 2/1981 |
| EP | 0 634 457 A1 | 8/1994 |
| JP | 49-74718 | 7/1974 |
| JP | 59-30509 A | 2/1984 |
| JP | 4-163552 A * | 6/1992 |
| JP | 6-75375 A | 3/1994 |
| JP | 11-209673 A | 8/1999 |
| JP | 3020660 B2 | 1/2000 |
| JP | 2002-323762 A * | 11/2002 |
| JP | 2002-371214 A | 12/2002 |
| JP | 2003-207887 A | 7/2003 |
| JP | 2003-207888 A | 7/2003 |
| WO | 91/13942 A1 | 9/1991 |
| WO | 96/33445 A1 | 10/1996 |
| WO | 01/94314 A1 | 12/2001 |
| WO | 02/083662 A2 | 10/2002 |
| WO | 02/083795 A2 | 10/2002 |

OTHER PUBLICATIONS

Computer-generated transaltion of JP 2002-323762 (Nov. 2002).*
JPO English-language abstract of JP 2002-323762 (Nov. 2002).*

* cited by examiner

*Primary Examiner* — John A. McPherson
(74) *Attorney, Agent, or Firm* — Sughrue Mion, PLLC

(57) ABSTRACT

A curable composition and a negative type color filter including a compound represented by the following formula (1). A is a residue of a five-membered heterocyclic diazo component A-NH$_2$. B$^1$ and B$^2$ are each —CR$^1$=, —CR$^2$= or N. R$^5$ and R$^6$ are each H, an aliphatic group, an aromatic group, a heterocyclic group or the like. G, R$^1$ and R$^2$ are each H, a halogen, an aliphatic group, an aromatic group, a heterocyclic group, a cyano group, a carboxyl group, a carbamoyl group, an alkoxycarbonyl group or the like. R$^1$ and R$^5$, or R$^5$ and R$^6$ may be bonded with each other to form a five-membered or six-membered ring.

Formula (1)

$$A-N=N-\underset{G}{\underset{|}{\overset{B^2=B^1}{\overset{|}{C}}}}-N\underset{R^6}{\overset{R^5}{<}}$$

17 Claims, No Drawings

CURABLE COMPOSITION, NEGATIVE TYPE COLOR FILTER AND METHOD OF PRODUCING THE SAME

This is a divisional of application Ser. No. 10/920,253 filed Aug. 18, 2004. The entire disclosure of the prior application, application Ser. No. 10/920,253, is hereby incorporated by reference.

CROSS-REFERENCE TO RELATED APPLICATION

This application claims priority under 35 USC 119 from Japanese Patent Application Nos. 2003-208090 and 2004-73070, the disclosure of which is incorporated by reference herein.

BACKGROUND OF THE INVENTION

1. Field of the Invention

The present invention relates to a curable composition including an aromatic nitrogen-containing heterocyclic azo dye, to a negative type color filter and to a method of producing the color filter.

2. Description of the Related Art

A pigment dispersion method is known as a method for producing a color filter to be used for a liquid crystal display device or a solid state image pickup device.

The pigment dispersion method is a method for producing a color filter by photolithography from colored radiosensitive compositions obtained by dispersing pigments in a variety of photosensitive compositions. In this method, obtained color filters are stable with respect to light and heat since pigments are used, and they are provided with sufficient positioning precision since patterning is carried out by photolithography. Thus the method has been widely used since it is suitable for producing a color filter for a high precision color display with a large size.

To produce such a color filter by the pigment dispersion method, a radiosensitive composition is applied to a substrate by a spin coater or a roll coater and dried to form a film, and the film is exposed to light and developed to obtain color pixels. These steps are repeated an appropriate number of times corresponding to the number of the hues, to obtain a color filter. Negative type photosensitive compositions containing photopolymerizable monomers and photopolymerization initiators together in alkali-soluble resins have been disclosed for use in the pigment dispersion method.

However, although further improved precision has recently been desired in a color filter for a solid state image pickup device, the resolution cannot be improved substantially by a conventional pigment dispersion method, and also, color irregularities are caused due to bulky particles of the pigment. Thus, such a conventional pigment dispersion method is unsuitable for uses where fine patterns are required, such as in a solid state image pickup device.

In order to achieve high image resolution, techniques in which dyes are used as the coloring materials have been investigated (see, for example, Japanese Patent Application Laid-open (JP-A) No. 6-75375). However, it has been found that a dye-containing curable composition has the following problems.

(1) Dyes are, in general, inferior to pigments in light fastness and heat resistance.

(2) It is difficult to obtain a liquid state curable composition having a desired spectrum since a conventional dye has a poor solubility in either an aqueous alkaline solution or an organic solvent (hereinafter, simply referred to as solvent in some cases).

(3) It is difficult to adjust the solubility (developing property) of cured parts and non-cured parts since most dyes interact with another component in the curable composition.

(4) A large quantity of a dye has to be added in the case where the molar extinction coefficient($\epsilon$) of the dye is low, and therefore, a content of other components such as polymerizable compounds (monomers), a binder, a photopolymerization initiator and the like have to be reduced in the curable composition, resulting in deterioration of the curability and the post-curing heat resistance of the composition and the developing property of (non) cured parts.

These problems have made it difficult to form a fine color pattern structured of a thin film for a highly precise color filter. Also, in the case of producing a color filter for a solid state image pickup device, unlike in the case of producing a semiconductor, the color pattern must be a film as thin as 1 μm or less. It is therefore necessary to add a large amount of dyes in a curable composition to obtain desired absorbance, with the result that the above problems arise.

Concerning highly durable dyes, it is usually demanded of colorants used for various uses to have in common the following properties. Specifically, it is necessary that these dyes have desirable absorbing characteristics for color reproducibility; are superior in durability under the environmental conditions under which the dyes are used, e.g., light fastness, heat resistance, moisture resistance, durability to acidic gases such as ozone, and chemical resistance durability with respect to sulfur dioxide and the like; and have a large molar extinction coefficient.

For example, phenol, naphthol or aniline is widely used as the coupling component of azo dyes, and azo dyes obtained by these coupling components and having a good hue are known. However, there is the problem that these dyes are inferior in light durability (see, for example, JP-A Nos. 59-30509 and 11-209673 and Japanese Patent No. 3020660). Also, several azo dyes containing pyridine or pyrazine as coupling components have been known (see, for example, JP-A No. 49-74718, EP23309, DE2513949, DE2832020 and DE2525505). However, at that time, the use of these dyes for color filters was unknown. Also, the azo dyes described in these documents have insufficient durability to light, heat, moisture and active gas in the environment. As to, particularly, magenta dyes, even the hue of these dyes are insufficient.

SUMMARY OF THE INVENTION

The present invention has been made in view of the above circumstances and provides a negative type color filter superior in hue (color reproducibility), light durability and heat durability, a method of producing the negative type color filter and a curable composition suitable for the formation of, for example, a color image (especially a negative type color filter) superior in hue (color reproducibility), light durability and heat durability.

Various dye compound derivatives were studied in detail, and as a result, it was found that an azo dye containing an aromatic nitrogen-containing six-membered hetero ring as a coupling component has a good hue as a dye and exhibits high durability to light and heat. Based on these findings, the invention has been made.

<1> According to a first aspect of the invention, there is provided a negative type color filter including a compound (azo dye) represented by the following formula (1):

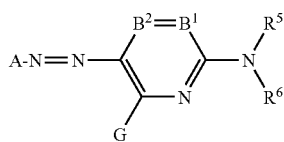

Formula (1)

wherein A represents a residue of a five-membered heterocyclic diazo component A-NH$_2$; B$^1$ and B$^2$ each independently represent —CR$^1$=, —CR$^2$= or a nitrogen atom provided that B$^1$ and B$^2$ do not both represent nitrogen atoms at the same time; R$^5$ and R$^6$ each independently represent a hydrogen atom, an aliphatic group, an aromatic group, a heterocyclic group, an acyl group, an alkoxycarbonyl group, an aryloxycarbonyl group, a carbamoyl group, an alkylsulfonyl group, an arylsulfonyl group or a sulfamoyl group provided that R$^5$ and R$^6$ do not both represent hydrogen atoms at the same time; G, R$^1$ and R$^2$ each independently represent a hydrogen atom, a halogen atom, an aliphatic group, an aromatic group, a heterocyclic group, a cyano group, a carboxyl group, a carbamoyl group, an alkoxycarbonyl group, an aryloxycarbonyl group, an acyl group, a hydroxy group, an alkoxy group, an aryloxy group, a silyloxy group, an acyloxy group, a carbamoyloxy group, a heterocyclic oxy group, an alkoxycarbonyloxy group, an aryloxycarbonyloxy group, an amino group substituted with an alkyl group, aryl group or heterocyclic group, an acylamino group, a ureide group, a sulfamoylamino group, an alkoxycarbonylamino group, aryloxycarbonylamino group, an alkylsulfonylamino group, an arylsulfonylamino group, an aryloxycarbonylamino group, a nitro group, an alkylthio group, an arylthio group, an alkylsulfonyl group, an arylsulfonyl group, an alkylsulfinyl group, an arylsulfinyl group, a sulfamoyl group, a sulfo group or a heterocyclic thio group; and R$^1$ and R$^5$, and/or R$^5$ and R$^6$ may be bonded with each other to form a five-membered or six-membered ring.

<2> According to a second aspect of the invention, there is provided a curable composition including a compound (azo dye) represented by the following formula (1):

Formula (1)

wherein A represents a residue of a five-membered heterocyclic diazo component A-NH$_2$; B$^1$ and B$^2$ each independently represent —CR$^1$=, —CR$^2$= or a nitrogen atom provided that B$^1$ and B$^2$ do not both represent nitrogen atoms at the same time; R$^5$ and R$^6$ each independently represent a hydrogen atom, an aliphatic group, an aromatic group, a heterocyclic group, an acyl group, an alkoxycarbonyl group, an aryloxycarbonyl group, a carbamoyl group, an alkylsulfonyl group, an arylsulfonyl group or a sulfamoyl group provided that R$^5$ and R$^6$ do not both represent hydrogen atoms at the same time; G, R$^1$ and R$^2$ each independently represent a hydrogen atom, a halogen atom, an aliphatic group, an aromatic group, a heterocyclic group, a cyano group, a carboxyl group, a carbamoyl group, an alkoxycarbonyl group, an aryloxycarbonyl group, an acyl group, a hydroxy group, an alkoxy group, an aryloxy group, a silyloxy group, an acyloxy group, a carbamoyloxy group, a heterocyclic oxy group, an alkoxycarbonyloxy group, an aryloxycarbonyloxy group, an amino group substituted with an alkyl group, aryl group or heterocyclic group, an acylamino group, a ureide group, a sulfamoylamino group, an alkoxycarbonylamino group, aryloxycarbonylamino group, an alkylsulfonylamino group, an arylsulfonylamino group, an aryloxycarbonylamino group, a nitro group, an alkylthio group, an arylthio group, an alkylsulfonyl group, an arylsulfonyl group, an alkylsulfinyl group, an arylsulfinyl group, a sulfamoyl group, a sulfo group or a heterocyclic thio group; and R$^1$ and R$^5$, and/or R$^5$ and R$^6$ may be bonded with each other to form a five-membered or six-membered ring.

<3> According to a third aspect of the invention, there is provided a negative type color filter including a compound (azo dye) represented by the following formula (2):

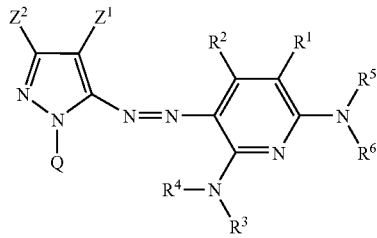

Formula (2)

wherein Z$^1$ represents an electron attractive group having a Hammett's substituent constant $\sigma_p$ value of 0.20 or more; Z$^2$ represents a hydrogen atom, an aliphatic group, an aromatic group or a heterocyclic group, R$^1$ and R$^2$ each independently represent a hydrogen atom, a halogen atom, an aliphatic group, an aromatic group, a heterocyclic group, a cyano group, a carboxyl group, a carbamoyl group, an alkoxycarbonyl group, an aryloxycarbonyl group, an acyl group, a hydroxy group, an alkoxy group, an aryloxy group, a silyloxy group, an acyloxy group, a carbamoyloxy group, a heterocyclic oxy group, an alkoxycarbonyloxy group, an aryloxycarbonyloxy group, an amino group substituted with an alkyl group, aryl group or heterocyclic group, an acylamino group, a ureide group, a sulfamoylamino group, an alkoxycarbonylamino group, an aryloxycarbonylamino group, an alkylsulfonylamino group, an arylsulfonylamino group, an aryloxycarbonylamino group, a nitro group, an alkylthio group, an arylthio group, an alkylsulfonyl group, an arylsulfonyl group, an alkylsulfinyl group, an arylsulfinyl group, a sulfamoyl group, a sulfo group or a heterocyclic thio group; R$^3$ and R$^4$ each independently represent a hydrogen atom, an aliphatic group, an aromatic group, a heterocyclic group, an acyl group, an alkoxycarbonyl group, an aryloxycarbonyl group, a carbamoyl group, a sulfonyl group or a sulfamoyl group; R$^5$ and R$^6$ each independently represent a hydrogen atom, an aliphatic group, an aromatic group, a heterocyclic group, an acyl group, an alkoxycarbonyl group, an aryloxycarbonyl group, a carbamoyl group, an alkylsulfonyl group, an arylsulfonyl group or a sulfamoyl group provided that R$^5$ and R$^6$ do not both represent hydrogen atoms at the same time; R$^1$ and R$^5$, and/or R$^5$ and R$^6$ may be bonded with each other to form a five-membered or six-membered ring; and Q represents a hydrogen atom, an aliphatic group, an aromatic group or a heterocyclic group.

<4> According to a fourth aspect of the invention, there is provided a curable composition including a compound (azo dye) represented by the following formula (2):

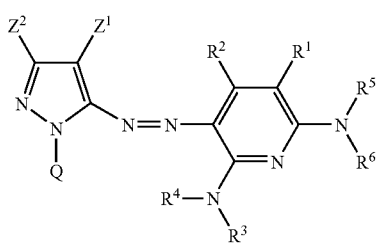

Formula (2)

wherein $Z^1$ represents an electron attractive group having a Hammett's substituent constant $\sigma_p$ value of 0.20 or more; $Z^2$ represents a hydrogen atom, an aliphatic group, an aromatic group or a heterocyclic group, $R^1$ and $R^2$ each independently represent a hydrogen atom, a halogen atom, an aliphatic group, an aromatic group, a heterocyclic group, a cyano group, a carboxyl group, a carbamoyl group, an alkoxycarbonyl group, an aryloxycarbonyl group, an acyl group, a hydroxy group, an alkoxy group, an aryloxy group, a silyloxy group, an acyloxy group, a carbamoyloxy group, a heterocyclic oxy group, an alkoxycarbonyloxy group, an aryloxycarbonyloxy group, an amino group substituted with an alkyl group, aryl group or heterocyclic group, an acylamino group, a ureide group, a sulfamoylamino group, an alkoxycarbonylamino group, an aryloxycarbonylamino group, an alkylsulfonylamino group, an arylsulfonylamino group, an aryloxycarbonylamino group, a nitro group, an alkylthio group, an arylthio group, an alkylsulfonyl group, an arylsulfonyl group, an alkylsulfinyl group, an arylsulfinyl group, a sulfamoyl group, a sulfo group or a heterocyclic thio group; $R^3$ and $R^4$ each independently represent a hydrogen atom, an aliphatic group, an aromatic group, a heterocyclic group, an acyl group, an alkoxycarbonyl group, an aryloxycarbonyl group, a carbamoyl group, a sulfonyl group or a sulfamoyl group; $R^5$ and $R^6$ each independently represent a hydrogen atom, an aliphatic group, an aromatic group, a heterocyclic group, an acyl group, an alkoxycarbonyl group, an aryloxycarbonyl group, a carbamoyl group, an alkylsulfonyl group, an arylsulfonyl group or a sulfamoyl group provided that $R^5$ and $R^6$ do not both represent hydrogen atoms at the same time; $R^1$ and $R^5$, and/or $R^5$ and $R^6$ may be bonded with each other to form a five-membered or six-membered ring; and Q represents a hydrogen atom, an aliphatic group, an aromatic group or a heterocyclic group.

<5> According to a further aspect of the invention, there is provided a method of producing a negative type color filter, the method including applying the curable composition according to the above second or fourth aspect to a support, exposing the curable composition to light through a mask, and developing the curable composition to form a pattern image.

DETAILED DESCRIPTION OF THE INVENTION

A negative type color filter, a method of producing a negative type color filter, and a curable composition according to the present invention will be hereinafter explained in detail.

The negative type color filter and the curable composition of the present invention include an azo dye represented by the formula (1) shown below as a dye soluble in an organic solvent, preferably further include a binder, a radiosensitive compound and a monomer, and, according to need, include other components such as a crosslinking agent. The color filter of the invention is preferably formed by coating a support with a curable composition containing the azo dye.

(Azo Dye)

The azo dye represented by the formula (1) according to the invention will be explained in detail.

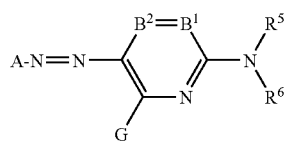

Formula (1)

In the formula (1), A represents a residue of a five-membered heterocyclic diazo component A-$NH_2$. Examples of the heteroatom of the five-membered hetero ring constituting A of this A-$NH_2$ may include N, O and S. The hetero ring is preferably a nitrogen-containing five-membered hetero ring which may be combined with an aliphatic ring, aromatic ring or other hetero ring by condensation.

Preferable examples of the hetero ring in A may include a pyrazole ring, imidazole ring, thiazole ring, isothiazole ring, thiadiazole ring, benzothiazole ring, benzoxazole ring and benzoisothiazole ring. Such hetero rings may further have a substituent. Among these hetero rings, a pyrazole ring, imidazole ring, isothiazole ring, thiadiazole ring and benzothiazole ring represented by the following formulae (a) to (f) are preferable.

Formulae (a) to (f)

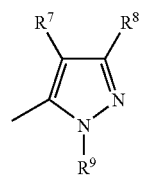

(a)

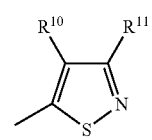

(b)

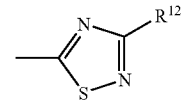

(c)

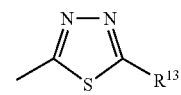

(d)

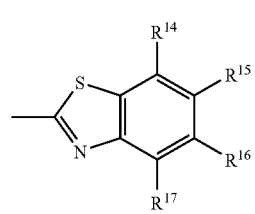

(e)

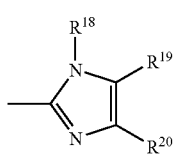

(f)

$R^7$ to $R^{20}$ in the above formulae (a) to (f) each have the same meaning as G, $R^1$ or $R^2$ which will be explained later and each preferable form is also the same. A pyrazole ring and isothiazole ring represented by the formula (a) or (b) are preferable among the formulae (a) to (f), and a pyrazole ring represented by the formula (a) is most preferable.

$B^1$ and $B^2$ each independently represent —$CR^1$=, —$CR^2$= or a nitrogen atom provided that $B^1$ and $B^2$ do not both represent nitrogen atoms at the same time. Specifically, $B^1$ and $B^2$ each represent —$CR^1$= or —$CR^2$=, or either one of $B^1$ and $B^2$ represents a nitrogen atom and the other represents —$CR^1$= or —$CR^2$=. It is particularly preferable that $B^1$ and $B^2$ each represent —$CR^1$= or —$CR^2$=.

$R^5$ and $R^6$ each independently represent a hydrogen atom, an aliphatic group, an aromatic group, a heterocyclic group, an acyl group, an alkoxycarbonyl group, an aryloxycarbonyl group, a carbamoyl group, an alkylsulfonyl group, an arylsulfonyl group or a sulfamoyl group, and such groups may further have a substituent. Preferable examples of the group represented by $R^5$ or $R^6$ include a hydrogen atom, aliphatic group, aromatic group, heterocyclic group, acyl group, alkylsulfonyl group and arylsulfonyl group. More preferable examples of the group represented by $R^5$ or $R^6$ include a hydrogen atom, aromatic group, heterocyclic group, acyl group, alkylsulfonyl group, and arylsulfonyl group and most preferable examples of the group represented by $R^5$ or $R^6$ include a hydrogen atom, aryl group and heterocyclic group. It is preferable that such preferable groups further have a substituent. However, $R^5$ and $R^6$ do not both represent hydrogen atoms at the same time.

The above G, $R^1$ and $R^2$ each independently represent a hydrogen atom, a halogen atom, an aliphatic group, an aromatic group, a heterocyclic group, a cyano group, a carboxyl group, a carbamoyl group, an alkoxycarbonyl group, an aryloxycarbonyl group, an acyl group, a hydroxy group, an alkoxy group, an aryloxy group, a silyloxy group, an acyloxy group, a carbamoyloxy group, a heterocyclic oxy group, an alkoxycarbonyloxy group, an aryloxycarbonyloxy group, "an amino group substituted with an alkyl group, aryl group or heterocyclic group", an acylamino group, a ureide group, a sulfamoylamino group, an alkoxycarbonylamino group, an aryloxycarbonylamino group, an alkylsulfonylamino group, an arylsulfonylamino group, an aryloxycarbonylamino group, a nitro group, an alkylthio group, an arylthio group, an alkylsulfonyl group, an arylsulfonyl group, an alkylsulfinyl group, an arylsulfinyl group, a sulfamoyl group, a sulfo group or a heterocyclic thio group, and such groups may be further substituted.

Preferable examples of the group represented by G include a hydrogen atom, halogen atom, aliphatic group, aromatic group, hydroxy group, alkoxy group, aryloxy group, acyloxy group, heterocyclic oxy group, "amino group substituted with an alkyl group, aryl group or heterocyclic group", acylamino group, ureide group, sulfamoylamino group, alkoxycarbonylamino group, aryloxycarbonylamino group, alkylthio group, arylthio group and heterocyclic thio group. More preferable examples of the group represented by G include a hydrogen atom, halogen atom, alkyl group, hydroxy group, alkoxy group, aryloxy group, acyloxy group, "amino group substituted with an alkyl group, aryl group or heterocyclic group" and acylamino group. Among these groups, a hydrogen atom, arylamino group and amide group are most preferable. Such groups may further have a substituent.

Preferable examples of the group represented by $R^1$ or $R^2$ may include a hydrogen atom, alkyl group, alkoxycarbonyl group, carboxyl group, carbamoyl group and cyano group. Such groups may further have a substituent.

Also, $R^1$ and $R^5$ and/or $R^5$ and $R^6$ may be bonded with each other to form a five-membered or six-membered ring.

When a group represented by A, $R^1$, $R^2$, $R^5$, $R^6$ or G further has a substituent, examples of the substituent may include the same substituents as those exemplified for G, $R^1$ and $R^2$.

When the azo dye represented by the formula (1) is a water-soluble dye, any one of A, $R^1$, $R^2$, $R^5$, $R^6$ and G preferably further has an ionic hydrophilic group as a substituent. Examples of the ionically hydrophilic group as the substituent include a sulfo group, carboxyl group and quaternary ammonium group. As the ionically hydrophilic group, a carboxyl group and sulfo group are preferable and a sulfo group is particularly preferable. The carboxyl group and sulfo group may be in a salt state. Examples of the counter ion forming the salt include alkali metal ions (e.g., a sodium ion and potassium ion) and organic cations (e.g., a tetramethylguanidium ion).

Each group relating to the formula (1) will be explained in detail.

In this specification, examples of the halogen atom include a fluorine atom, chlorine atom and bromine atom.

In this specification, the aliphatic group means alkyl groups, substituted alkyl groups, alkenyl groups, substituted alkenyl groups, alkinyl groups, substituted alkinyl groups, aralkyl groups and substituted aralkyl groups. The aliphatic group may be branched or may form a ring. The number of carbons of the aliphatic group is preferably 1 to 20 and more preferably 1 to 16. The aryl part of the aralkyl group or substituted aralkyl group is preferably phenyl or naphthyl and particularly preferably phenyl. Examples of the aliphatic group may include a methyl group, ethyl group, butyl group, isopropyl group, t-butyl group, hydroxyethyl group, methoxyethyl group, cyanoethyl group, trifluoromethyl group, 3-sulfopropyl group, 4-sulfobutyl group, cyclohexyl group, benzyl group, 2-phenethyl group, vinyl group and allyl group.

In this specification, the aromatic group means an aryl group and substituted aryl group. The aryl group is preferably a phenyl group or naphthyl group and particularly preferably a phenyl group. The number of carbons of the aromatic group is preferably 6 to 20 and more preferably 6 to 16. Examples of the aromatic group include a phenyl group, p-tolyl group, p-methoxyphenyl group, o-chlorophenyl group and m-(3-sulfopropylamino)phenyl group.

In this specification, examples of the heterocyclic group include heterocyclic groups having a substituent and unsubstituted heterocyclic groups. An aliphatic ring, aromatic ring or other hetero ring may be combined with the hetero ring by condensation. As the heterocyclic group, a five-membered or six-membered heterocyclic group is preferable. Examples of the substituent include an aliphatic group, halogen atom, alkyl or arylsulfonyl group, acyl group, acylamino group, sulfamoyl group, carbamoyl group and ionic hydrophilic group. Examples of the heterocyclic group include a 2-pyridyl group, 2-thienyl group, 2-thiazolyl group, 2-benzothiazolyl group, 2-benzoxazolyl group and 2-furyl group.

Also, examples of the carbamoyl group include carbamoyl groups having a substituent and unsubstituted carbamoyl groups. Examples of the substituent include alkyl groups.

Examples of the carbamoyl group include a methylcarbamoyl group and dimethylcarbamoyl group.

Examples of the alkoxycarbonyl group include alkoxycarbonyl groups having a substituent and unsubstituted alkoxycarbonyl groups. As the alkoxycarbonyl group, those having 2 to 12 carbon atoms are preferable. Examples of the substituent include ionic hydrophilic groups. Examples of the alkoxycarbonyl group include a methoxycarbonyl group and ethoxycarbonyl group.

Examples of the aryloxycarbonyl group include aryloxycarbonyl groups having a substituent and unsubstituted aryloxycarbonyl groups. As the aryloxycarbonyl group, those having 7 to 12 carbon atoms are preferable. Examples of the substituent include ionic hydrophilic groups. Examples of the aryloxycarbonyl group include a phenoxycarbonyl group.

Examples of the acyl group include acyl groups having a substituent and unsubstituted acyl groups. As the acyl group, those having 1 to 12 carbon atoms are preferable. Examples of the substituent include ionic hydrophilic groups. Examples of the acyl group include an acetyl group and benzoyl group.

Examples of the alkoxy group include alkoxy groups having a substituent and unsubstituted alkoxy groups. As the alkoxy group, those having 1 to 12 carbon atoms are preferable. Examples of the substituent include alkoxy groups, hydroxyl groups and ionic hydrophilic groups. Examples of the alkoxy group include a methoxy group, ethoxy group, isopropoxy group, methoxyethoxy group, hydroxyethoxy group and 3-carboxypropoxy group.

Examples of the aryloxy group include aryloxy groups having a substituent and unsubstituted aryloxy groups. As the aryloxy group, those having 6 to 12 carbon atoms are preferable. Examples of the substituent include alkoxy groups and ionic hydrophilic groups. Examples of the aryloxy group include a phenoxy group, p-methoxyphenoxy group and o-methoxyphenoxy group.

Examples of the acyloxy group include acyloxy groups having a substituent and unsubstituted acyloxy groups. As the acyloxy group, those having 1 to 12 carbon atoms are preferable. Examples of the substituent include ionic hydrophilic groups. Examples of the acyloxy group include an acetoxy group and benzoyloxy group.

Examples of the carbamoyloxy group include carbamoyloxy groups having a substituent and unsubstituted carbamoyloxy groups. Examples of the substituent include alkyl groups. Examples of the carbamoyloxy group include a N-methylcarbamoyloxy group.

The substituent of the "amino group substituted with an alkyl group, aryl group or heterocyclic group" may further have a substituent. Unsubstituted amino groups are not included. As the alkyl amino group, alkylamino groups having 1 to 6 carbon atoms are preferable. When the substituent further has a substituent, examples of the substituent include ionic hydrophilic groups. Examples of the alkylamino group include a methylamino group and diethylamino group. Examples of the arylamino group include arylamino groups having a substituent and unsubstituted arylamino groups. As the arylamino group, those having 6 to 12 carbon atoms are preferable. When the substituent further has a substituent, examples of the substituent include a halogen atom and ionic hydrophilic group. Examples of the arylamino group include an anilino group and 2-chloroanilino group.

Examples of the acylamino group include acylamino groups having a substituent. As the acylamino group, those having 2 to 12 carbon atoms are preferable. Examples of the substituent include ionic hydrophilic groups. Examples of the acylamino group include an acetylamino group, propionylamino group, benzoylamino group, N-phenylacetylamino group and 3,5-disulfobenzoylamino group.

Examples of the ureide group include ureide groups having a substituent and unsubstituted ureide groups. As the ureide group, those having 1 to 12 carbon atoms are preferable. Examples of the substituent include alkyl groups and aryl groups. Examples of the ureide group include a 3-methylureide group, 3,3-dimethylureide group and 3-phenylureide group.

Examples of the sulfamoylamino group include sulfamoylamino groups having a substituent and unsubstituted sulfamoylamino groups. Examples of the substituent include alkyl groups. Examples of the sulfamoylamino group include a N,N-dipropylsulfamoylamino group.

Examples of the alkoxycarbonylamino group include alkoxycarbonylamino groups having a substituent and unsubstituted alkoxycarbonylamino groups. As the alkoxycarbonylamino group, those having 2 to 12 carbon atoms are preferable. Examples of the substituent include ionic hydrophilic groups. Examples of the alkoxycarbonylamino group include an ethoxycarbonylamino group.

Examples of the aryloxycarbonylamino group include aryloxycarbonylamino groups having a substituent and unsubstituted aryloxycarbonylamino groups. As the aryloxycarbonylamino group, those having 7 to 12 carbon atoms are preferable. Examples of the substituent include ionic hydrophilic groups. Examples of the aryloxycarbonylamino group include a phenoxycarbonylamino group.

Examples of the alkylsulfonylamino group or arylsulfonylamino group include alkylsulfonylamino groups and arylsulfonylamino groups having a substituent, and unsubstituted alkylsulfonylamino groups and arylsulfonylamino groups. As the sulfonylamino group, those having 1 to 12 carbon atoms are preferable. Examples of the substituent include ionic hydrophilic groups. Examples of the sulfonylamino group include a methanesulfonylamino group, N-phenylmethanesulfonylamino group, benzenesulfonylamino group and 3-carboxybenzenesulfonylamino group.

Examples of the alkylthio group, arylthio group or heterocyclic thio group include alkylthio groups, arylthio groups and heterocyclic thio groups having a substituent, and unsubstituted alkylthio groups, arylthio groups and heterocyclic thio groups. As the alkylthio group, arylthio group and heterocyclic thio group, those having 1 to 12 carbon atoms are preferable. Examples of the substituent include ionic hydrophilic groups. Examples of the alkylthio groups, arylthio groups and heterocyclic thio groups include a methylthio group, phenylthio group and 2-pyridylthio group.

Examples of the alkylsulfonyl group and arylsulfonyl group may include a methanesulfonyl group and a phenylsulfonyl group respectively.

Examples of the alkylsulfinyl group and arylsulfinyl group may include a methanesulfinyl group and a phenylsulfinyl group respectively.

Examples of the sulfamoyl group include sulfamoyl groups having a substituent and unsubstituted sulfamoyl groups. Examples of the substituent include alkyl groups. Examples of the sulfamoyl group include a dimethylsulfamoyl group and di-(2-hydroxyethyl)sulfamoyl group.

In the invention, particularly preferable azo dyes are those represented by the following formula (2).

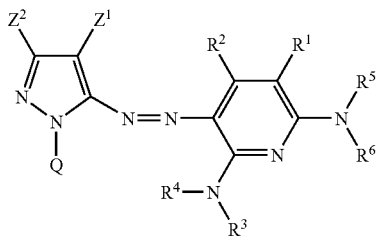

Formula (2)

In the formula (2), $Z^1$ represents an electron attractive group having a Hammett's substituent constant $\sigma_p$ of 0.20 or more. $Z^1$ is preferably an electron attractive group having a Hammett's substituent constant $\sigma_p$ of 0.30 to 1.0. Specific and preferable examples of the electron attractive group include those described later. Among these groups, acyl groups having 2 to 12 carbon atoms, alkyloxycarbonyl groups having 2 to 12 carbon atoms, nitro groups, cyano groups, alkylsulfonyl groups having 1 to 12 carbon atoms, arylsulfonyl groups having 6 to 18 carbon atoms, carbamoyl groups having 1 to 12 carbon atoms or alkyl halide groups having 1 to 12 carbon atoms are preferable. Cyano groups, alkylsulfonyl groups having 1 to 12 carbon atoms and arylsulfonyl groups having 6 to 18 carbon atoms are particularly preferable and cyano groups are most preferable.

$Z^2$ represents a hydrogen atom, an aliphatic group, an aromatic group or a heterocyclic group. The aliphatic group, aromatic group and heterocyclic group are the same as above. $R^1$, $R^2$, $R^5$ and $R^6$ in the formula (2) are also the same as $R^1$, $R^2$, $R^5$ and $R^6$ in the aforementioned formula (1) respectively and their preferable forms are also the same.

$R^3$ and $R^4$ in the formula (2) each independently represent a hydrogen atom, an aliphatic group, an aromatic group, a heterocyclic group, an acyl group, an alkoxycarbonyl group, an aryloxycarbonyl group, a carbamoyl group, an alkylsulfonyl group, an arylsulfonyl group or a sulfamoyl group. Among these groups, a hydrogen atom, aromatic group, heterocyclic group, acyl group, alkylsulfonyl group and arylsulfonyl group are preferable and a hydrogen atom, aromatic group and heterocyclic group are particularly preferable. The details of each group are as aforementioned.

Q represents a hydrogen atom, an aliphatic group, an aromatic group or a heterocyclic group. Q is, among these groups, preferably a group having a nonmetallic atom group necessary to form a five- to eight-membered ring. The five- to eight-membered ring may be substituted, and may be a saturated ring or may have an unsaturated bond. Among these groups, aromatic groups and heterocyclic groups are particularly preferable. Preferable examples of the nonmetallic atom include a nitrogen atom, oxygen atom, sulfur atom and carbon atom. Specific examples of the five- to eight-membered ring include a benzene ring, cyclopentane ring, cyclohexane ring, cycloheptane ring, cyclooctane ring, cyclohexene ring, pyridine ring, pyrimidine ring, pyrazine ring, pyridazine ring, triazine ring, imidazole ring, benzoimidazole ring, oxazole ring, benzoxazole ring, thiazole ring, benzothiazole ring, oxane ring, sulfolane ring and thian ring.

The groups in the formula (2) may further have a substituent. When any of these groups further has a substituent, examples of the substituent include the substituents explained for the aforementioned formula (1), the groups exemplified for G, $R^1$ or $R^2$, and ionic hydrophilic groups.

Here, the Hammett's substituent constant $\sigma_p$ value used in this specification will be explained in relation to the substituent $Z^1$.

Hammett's rule is an empirical rule proposed by L. P. Hammett in 1935 to discuss the influence of a substituent on the reaction and equilibrium of benzene derivatives quantitatively. The validity of this rule is widely recognized today. The substituent constants based on Hammett's rule include a $\sigma_p$ value, and a $\sigma_m$ value and these $\sigma_p$ and $\sigma_m$ values are found in many general published documents. These values are described in detail in, for example, "Lange's Handbook of Chemistry" edited by J. A. Dean, Vol. 12 (1979) (McGraw-Hill) and "The Realm of Chemistry (Kagaku no Ryoiki)" special issue, No. 122, pp. 96-103, (1979) (Nankodo). Each substituent is limited or explained by the Hammett's substituent constant $\sigma_p$ value in the present invention; however, this does not mean that the substituents are limited to only those whose Hammett's constant $\sigma_p$ values can be found as known values in the aforementioned published documents, and those whose Hammett's constant $\sigma_p$ values are unknown from literature but fall within specified ranges when measured based on Hammett's rule are included. Although compounds which are not benzene derivatives are included in the compounds represented by the formulae (1) and (2), the $\sigma_p$ value is used as the standard showing the electronic effect of a substituent irrespective of the substitution position. Accordingly, in the invention, the $\sigma_p$ value is used according to this meaning.

Examples of electron attractive groups having a Hammett's substituent constant $\sigma_p$ value of 0.60 or more may include a cyano group, nitro group and alkylsulfonyl group (e.g., a methanesulfonyl group), arylsulfonyl group (e.g., a benzenesulfonyl group).

Examples of electron attractive groups having a Hammett's substituent constant $\sigma_p$ value of 0.45 or more include, besides the above, an acyl group (e.g., an acetyl group), alkoxycarbonyl group (e.g., dodecyloxycarbonyl group), aryloxycarbonyl group (e.g., m-chlorophenoxycarbonyl group), alkylsulfinyl group (e.g., n-propylsulfinyl group), arylsulfinyl group (e.g., phenylsulfinyl group), sulfamoyl group (e.g., N-ethylsulfamoyl group and N,N-dimethylsulfamoyl group) and alkyl halide group (e.g., trifluoromethyl group).

Examples of electron attractive groups having a Hammett's substituent constant $\sigma_p$ value of 0.30 or more may include, besides the above, an acyloxy group (e.g., acetoxy group), carbamoyl group (e.g., N-ethylcarbamoyl group and N,N-dibutylcarbamoyl group), alkoxy halide group (e.g., trifluoromethyloxy group), aryloxy halide group (e.g., pentafluorophenyloxy group), sulfonyloxy group (e.g., a methylsulfonyloxy group), alkylthio halide group (e.g., difluoromethylthio group), aryl group substituted with two or more electron attractive groups having an $\sigma_p$ value of 0.15 or more (e.g., 2,4-dinitrophenyl group and pentachlorophenyl group) and hetero ring (e.g., 2-benzoxazolyl group, 2-benzothiazolyl group and 1-phenyl-2-benzimidazolyl group).

Examples of electron attractive groups having a $\sigma_p$ value of 0.20 or more include, besides the above, halogen atoms.

Particularly preferable combinations of the substituents for the azo dye represented by the formula (1) are as follows.

(a) $R^5$ and $R^6$ are each preferably a hydrogen atom, an alkyl group, an aryl group, a heterocyclic group, an alkylsulfonyl group, an arylsulfonyl group or an acyl group, more preferably a hydrogen atom, an aryl group, a heterocyclic group, an alkylsulfonyl group or an arylsulfonyl group and most preferably a hydrogen atom, an aryl group or a heterocyclic group provided that $R^5$ and $R^6$ do not represent hydrogen atoms at the same time.

(b) G is preferably a hydrogen atom, a halogen atom, an alkyl group, a hydroxy group, "an amino group substituted with an alkyl group, aryl group or heterocyclic group" or an amide group, more preferably a hydrogen atom, a halogen atom, "an amino group substituted with an alkyl group, aryl group or heterocyclic group" or an amide group and most preferably a hydrogen atom, "an amino group substituted with an alkyl group, aryl group or heterocyclic group" or an amide group.
(c) A is preferably a pyrazole ring, an imidazole ring, an isothiazole ring, a thiadiazole ring or a benzothiazole ring, more preferably a pyrazole ring or an isothiazole ring and most preferably a pyrazole ring.
(d) $B^1$ and $B^2$ are each —$CR^1$= or —$CR^2$=, where $R^1$ and $R^2$ are each preferably a hydrogen atom, a halogen atom, a cyano group, a carbamoyl group, a carboxyl group, an alkyl group, a hydroxy group or an alkoxy group and more preferably a hydrogen atom, a cyano group, a carbamoyl group or an alkyl group.

As to preferable combinations of the substituents for the compound represented by the formula (1), compounds in which at least one of the aforementioned various substituents is the above preferable group are preferable, compounds in which many more groups among the aforementioned various substituents are the above preferable groups are more preferable and compounds in which all the aforementioned various substituents are the above preferable groups are most preferable.

Specific examples (exemplified compounds a-1 to a-36, b-1 to b-8, c-1 to c-5, d-1 to d-5, e-1 to e-5, f-1 to f-33 and g-1 to g-65) of the azo dyes represented by the formula (1) or (2) will be shown below: however, these examples are not intended to be limiting of the invention.

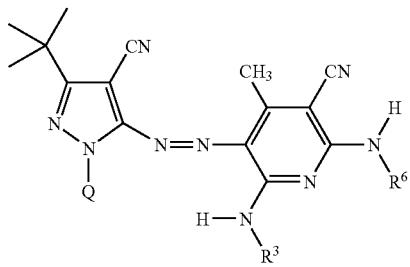

| Dye | Q | $R^3$ | $R^6$ |
|---|---|---|---|
| a-1 | 2-benzothiazolyl | —C₆H₄—C₈H₁₇ | —C₆H₄—C₈H₁₇ |
| a-2 | 5-Cl-2-benzothiazolyl | —C₆H₄—C₈H₁₇ | 2,4,6-trimethylphenyl |
| a-3 | 6-Cl-2-benzothiazolyl | 2,4,6-trimethylphenyl | —C₆H₄—C₈H₁₇ |
| a-4 | 2-benzothiazolyl | 2-OC₈H₁₇-phenyl | —C₆H₄—C₈H₁₇ |
| a-5 | 5-NO₂-2-benzothiazolyl | 2,4-dimethylphenyl | 2,4-dimethylphenyl |

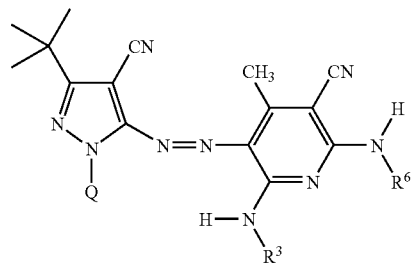

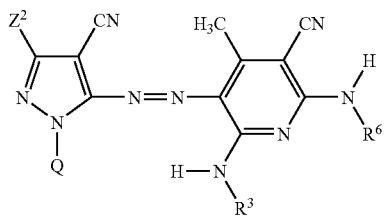

| Dye | $Z^2$ | Q | $R^3$ | $R^6$ |
|---|---|---|---|---|
| a-11 | tert-butyl | 2-benzothiazolyl-6-SO₃Na | 4-methylphenyl | 4-SO₃Na-phenyl |
| a-12 | tert-butyl | 2-benzothiazolyl-6-SO₃K | 2-SO₃K-phenyl | 2-SO₃K-phenyl |
| a-13 | phenyl | 2-benzothiazolyl-6-COOH | 4-SO₃K-phenyl | 3-COOH-phenyl |
| a-14 | 2-chlorophenyl | 2-benzothiazolyl-SO₂K (4,5-mix) | 4-SO₃K-phenyl | 3-COOH-phenyl |
| a-15 | 4-SO₃K-phenyl | 2-benzothiazolyl | 2-SO₃K-phenyl | 3-COOH-phenyl |

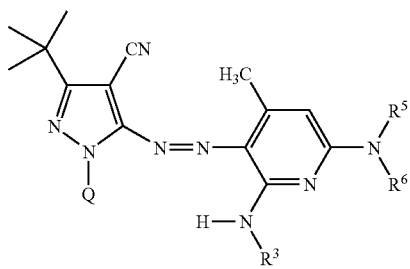

| Dye | Q | $R^5$ | $R^6$ | $R^3$ |
|---|---|---|---|---|
| a-16 | 2-benzothiazolyl-6-SO₂NH₂ | 2-benzothiazolyl-6-SO₂NH₂ | mesityl | mesityl |

-continued

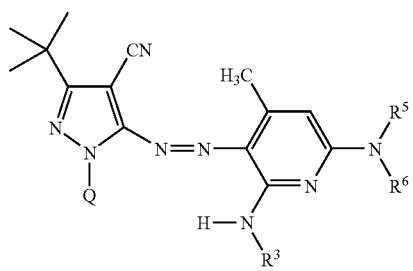

| Dye | Q | R⁵ | R⁶ | R³ |
|---|---|---|---|---|
| a-17 | 2-methyl-5-chlorobenzothiazolyl | —SO₂CH₃ | 2,4,5-trimethylphenyl | 4-methylphenyl |
| a-18 | 2-methylbenzothiazolyl | —COCH₃ | C₈H₁₇(t) | C₈H₁₇(t) |
| a-19 | 2-methyl-5-chlorobenzothiazolyl | 2-methylbenzothiazolyl | 2,4-dimethylphenyl | phenyl |
| a-20 | 2-methyl-6-chlorobenzothiazolyl | —SO₂CH₃ | 2,4-dimethylphenyl | C₈H₁₇(t) |

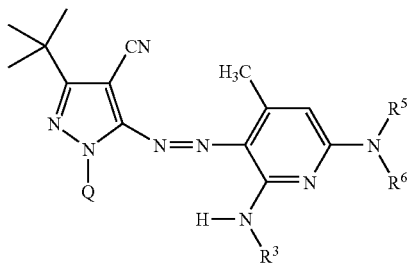

| Dye | Q | R⁵ |
|---|---|---|
| a-21 | 2-methylbenzothiazolyl | 2-methylbenzothiazol-6-yl-SO₂NH—(CH₂)₃—O—(2,4-di-tert-pentylphenyl) |
| a-22 | 2-methylbenzothiazol-6-yl-SO₂NH—(CH₂)₃—O—(2,4-di-tert-pentylphenyl) | 2-methylbenzothiazol-6-yl-SO₂NH—(CH₂)₃—O—(2,4-di-tert-pentylphenyl) |

-continued
| | | |
|---|---|---|
| a-23 | 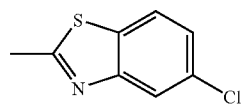 | 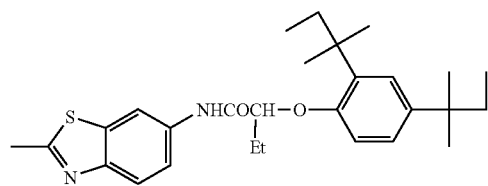 |
| a-24 | 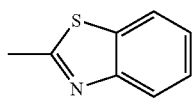 | 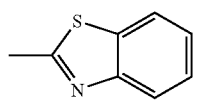 |
| a-25 | 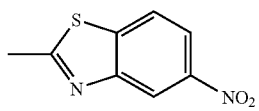 | 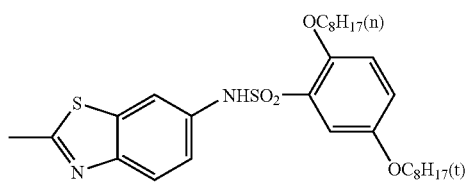 |
| Dye | $R^6$ | $R^3$ |
|---|---|---|
| a-21 | 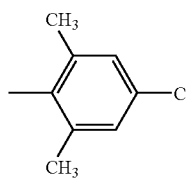 | 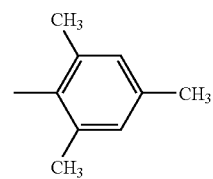 |
| a-22 | 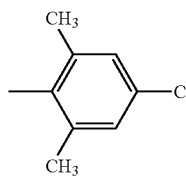 | 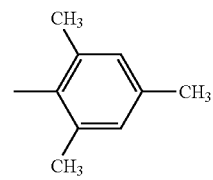 |
| a-23 | 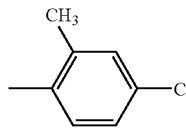 | 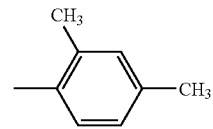 |
| a-24 | 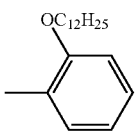 | 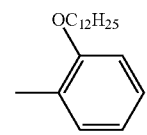 |
| a-25 | 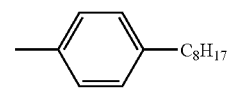 | $C_8H_{17}(t)$ |

| Dye | Q | R⁵ |
|---|---|---|
| a-26 | 2-methylbenzothiazole-6-SO₃K | 2-methylbenzothiazole-6-SO₃K |
| a-27 | 2-methylbenzothiazole-6-SO₂NH-(3,5-dicarboxyphenyl) | 2-methylbenzothiazole-6-SO₂NH-(3,5-dicarboxyphenyl) |
| a-28 | 2-methylbenzothiazole-SO₂NH-(3,5-dicarboxyphenyl) (5,6-mix) | 2-methylbenzothiazole-SO₂NH-(3,5-dicarboxyphenyl) (5,6-mix) |
| a-29 | 2-methylbenzothiazole-SO₃Na (5,6-mix) | 2-methylbenzothiazole-SO₂NH-(3,5-dicarboxyphenyl) (5,6-mix) |

| Dye | R⁶ | R³ |
|---|---|---|
| a-26 | 2,4,6-trimethylphenyl | 2,4,6-trimethylphenyl |
| a-27 | 2,4,6-trimethylphenyl | 2,4,6-trimethylphenyl |
| a-28 | 2,4,6-trimethylphenyl | 2,4,6-trimethylphenyl |

-continued
| | a-29 | 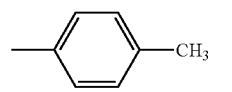 | 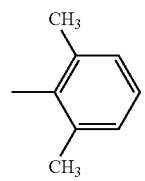 |
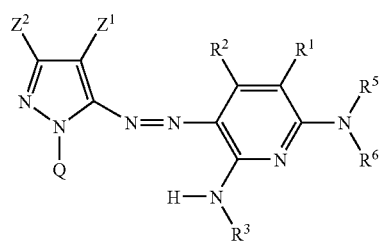
| Dye | Z² | Z¹ | Q | R² | R¹ | R⁵ | R⁶ | R³ |
|---|---|---|---|---|---|---|---|---|
| a-30 | ![CH3-phenyl] | CN | ![2-pyridyl] | H | CONH₂ | —SO₂CH₃ | ![OC8H17-tolyl] | ![CH3-phenyl] |
| a-31 | ![t-Bu] | Br | ![2-methylpyrimidinyl] | COOEt | H | ![2-methylbenzothiazolyl] | C₈H₁₇(t) | —COCH₃ |
| a-32 | ![2-pyridyl] | —SO₂CH₃ | ![triazine-NHCH3] | NHCH₃ | CONH₂ | H | ![6-Cl-2-methylbenzothiazolyl] | ![p-tolyl] | CO—t-Bu |
| a-33 | ![t-Bu] | CN | ![dicyano-methylphenyl] | H | H | ![5-Cl-2-methylbenzothiazolyl] | ![CH3-tolyl] | —SO₂CH₃ |

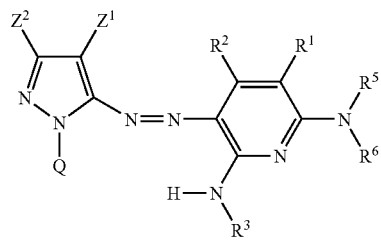

| Dye | Z² | Z¹ | Q | R² | R¹ | R⁵ | R⁶ | R³ |
|---|---|---|---|---|---|---|---|---|
| a-34 | t-Bu | Br | 2,6-dichloro-3-methyl-4-nitrophenyl | H | CONH₂ | COCH₃ | mesityl | 4-C₈H₁₇-phenyl |
| a-35 | t-Bu | CN | 2-methylbenzothiazolyl | CH₃ | H | 2-methylbenzothiazolyl | 2,6-diethyl-4-methylphenyl | 2,6-diethyl-4-methylphenyl |
| a-36 | t-Bu | CN | 2-methylbenzothiazolyl | CH₃ | CN | H | 2,6-diethyl-4-methylphenyl | 2,6-diethyl-4-methylphenyl |

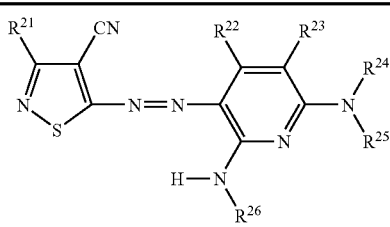

| Dye | R²¹ | R²² | R²³ | R²⁴ | R²⁵ | R²⁶ |
|---|---|---|---|---|---|---|
| b-1 | CH₃ | CH₃ | CN | H | 4-C₈H₁₇-phenyl | 4-C₈H₁₇-phenyl |
| b-2 | t-Bu | CH₃ | CN | H | mesityl | mesityl |
| b-3 | CH₃ | CH₃ | CONH₂ | H | 4-C₈H₁₇-phenyl | 4-C₈H₁₇-phenyl |

-continued
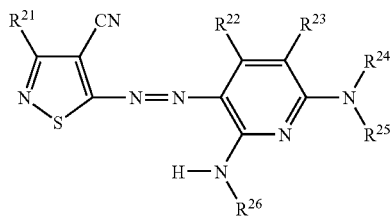
| Dye | R²¹ | R²² | R²³ | R²⁴ | R²⁵ | R²⁶ |
|---|---|---|---|---|---|---|
| b-4 | CH₃ | CH₃ | H | H | 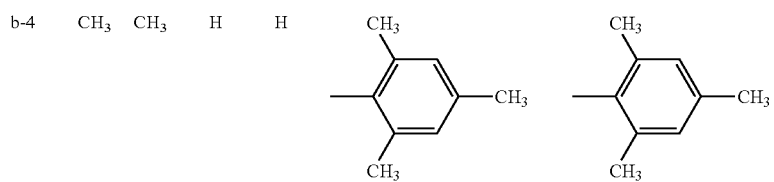 | |
| b-5 | CH₃ | H | CN | H | 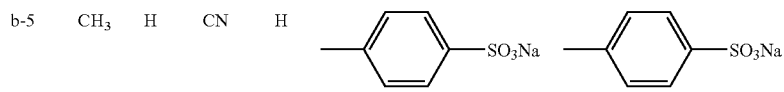 | |
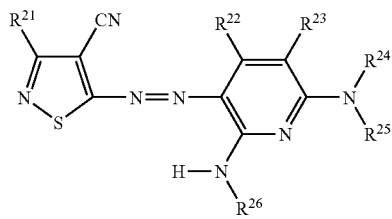
| Dye | R²¹ | R²² | R²³ | R²⁴ | R²⁵ | R²⁶ |
|---|---|---|---|---|---|---|
| b-6 | CH₃ | CH₃ | H | 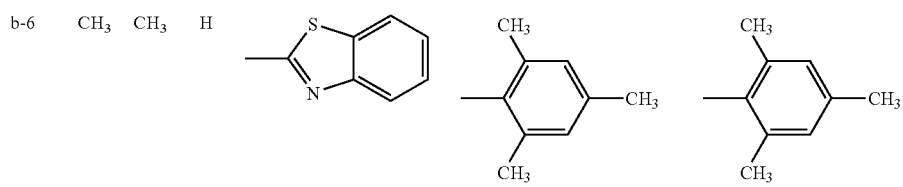 | | |
| b-7 | CH₃ | CH₃ | H | 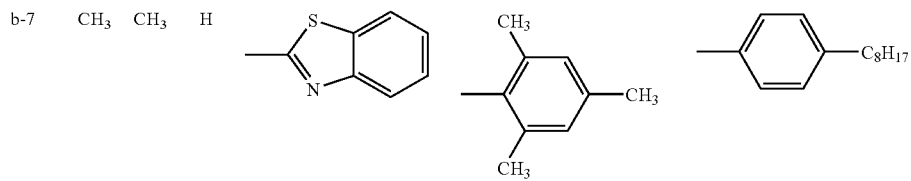 | | |
| b-8 | CH₃ | H | H | —SO₂CH₃ | 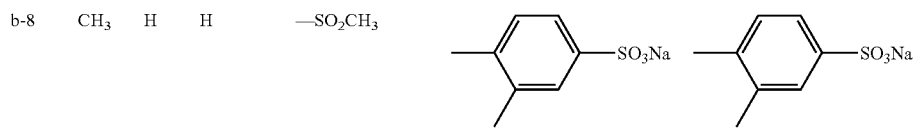 | |

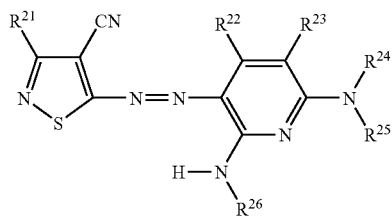
| Dye | R²¹ | R²² | R²³ | R²⁴ |
|---|---|---|---|---|
| c-1 | —SCH₃ | CH₃ | CN | H |
| c-2 | phenyl | H | CONH₂ | H |
| c-3 | —S–CH₂CH₂–SO₃K | CH₃ | H | 2-methyl-benzothiazol-6-yl-SO₃K |
| c-4 | —CH₃ | CH₃ | H | 2-methyl-benzothiazol-6-yl-SO₂NH-(CH₂)₃-O-(2,4-di-tert-amylphenyl) |
| c-5 | phenyl | H | H | 2-methyl-benzothiazol-6-yl-NHSO₂-(2-OC₈H₁₇(n)-4-C₈H₁₇(t)-phenyl) |
| Dye | R²⁵ | R²⁶ |
|---|---|---|
| c-1 | C₈H₁₇(t) | 4-C₈H₁₇-phenyl |
| c-2 | 4-SO₃K-phenyl | 4-SO₃K-phenyl |
| c-3 | 4-SO₃K-phenyl | 4-SO₃K-phenyl |
| c-4 | 2,4,6-trimethylphenyl | 4-C₈H₁₇-phenyl |

-continued
| | c-5 | 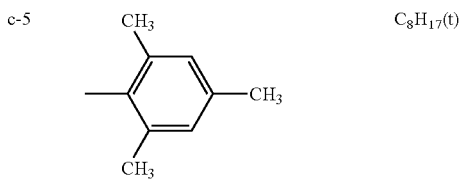 | C₈H₁₇(t) |
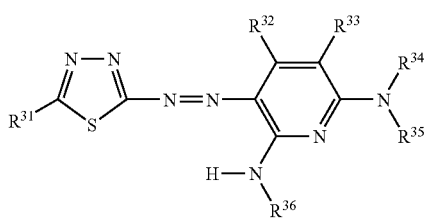
| Dye | R³¹ | R³² | R³³ | R³⁴ | R³⁵ | R³⁶ |
|---|---|---|---|---|---|---|
| d-1 | Me | CH₃ | CN | H |  —SO₃K | 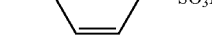 —SO₃K |
| d-2 | Me | CH₃ | CN | H | 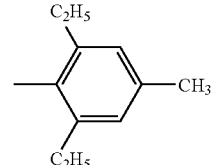 | 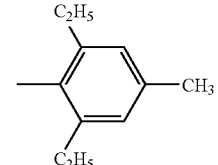 |
| d-3 | Me | H | H | 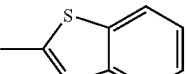 | 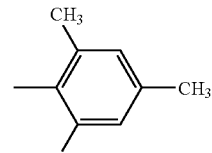 | 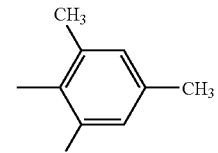 |
| d-4 | Ph | CH₃ | CONH₂ | H | 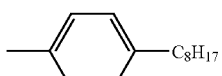 —C₈H₁₇ | 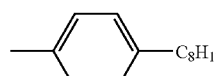 —C₈H₁₇ |
| d-5 | Ph | CH₃ | H | 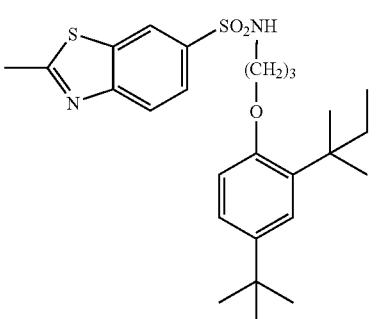 | 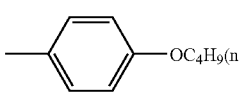 —OC₄H₉(n) | 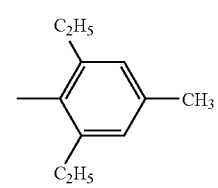 |

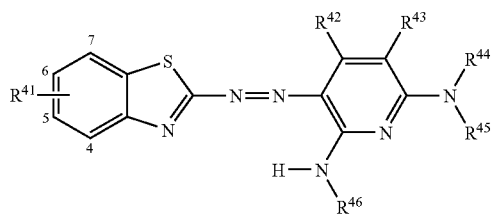

| Dye | $R^{41}$ | $R^{42}$ | $R^{43}$ | $R^{44}$ | $R^{45}$ | $R^{46}$ |
|---|---|---|---|---|---|---|
| e-1 | 5-Cl | CH₃ | CONH₂ | H | —C₈H₁₇(t) | —C₈H₁₇(t) |
| e-2 | 5,6-diCl | H | H | (2-methylbenzothiazolyl) | 4-C₈H₁₇-phenyl | 4-C₈H₁₇-phenyl |
| e-3 | 5,6-diCl | CH₃ | H | (2-methylbenzothiazolyl) | 2,4,6-trimethylphenyl | —CH₂CH(C₂H₅)CH₂CH₂CH₃ |
| e-4 | 5-Cl | H | CN | H | 4-SO₃K-phenyl | 4-SO₃K-phenyl |
| e-5 | 5-Cl | CH₃ | H | H | 2,3-dimethylphenyl | —CH₂CH(C₂H₅)CH₂CH₂CH₃ |

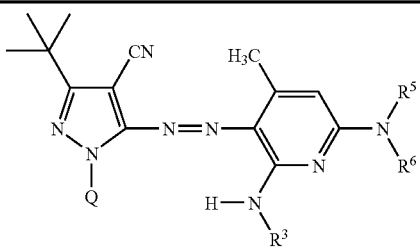

| Dye | Q | $R^3$ | $R^5$ | $R^6$ |
|---|---|---|---|---|
| f-1 | 2-methylbenzothiazol-6-yl-SO₃K | 2,4,6-trimethyl-3-SO₃K-phenyl | 2-methylbenzothiazol-6-yl-SO₃K | 2,4,6-trimethyl-3-SO₃K-phenyl |
| f-2 | 2-methylbenzothiazol-6-yl-SO₃Na | 2-methyl-4-SO₃Na-phenyl | 2-methylbenzothiazol-6-yl-SO₃Na | 2-methyl-4-SO₃Na-phenyl |

-continued

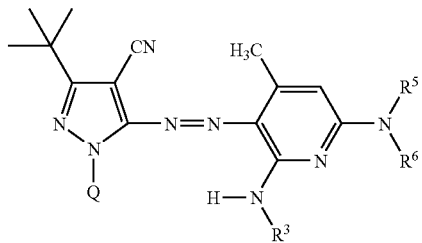

| Dye | Q | R³ | R⁵ | R⁶ |
|---|---|---|---|---|
| f-3 | 2-benzothiazolyl | 3,4,5-trimethylphenyl-SO₃K | 2-benzothiazolyl | 3,4,5-trimethylphenyl-SO₃K |
| f-4 | 2-benzothiazolyl | 2,3,5-trimethyl-4,6-bis(SO₃K)phenyl | 2-benzothiazolyl | 2,3,5-trimethyl-4,6-bis(SO₃K)phenyl |
| f-5 | 2-(5-nitro)benzothiazolyl | 3,4-dimethylphenyl-SO₃K | 2-(6-SO₃K)benzothiazolyl | 2-methoxy-4-methyl-5-SO₃K-phenyl |

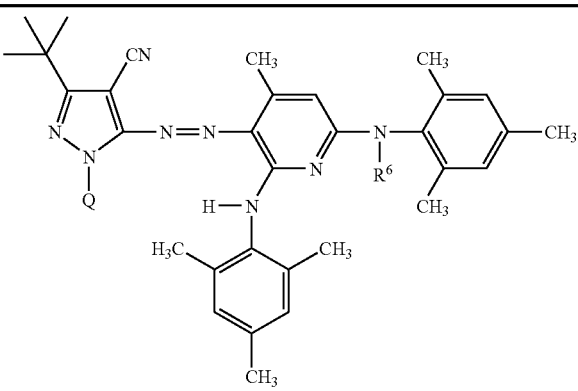

| Dye | Q | R⁶ |
|---|---|---|
| f-6 | 2-(6-(SO₂NHCH₂CH(C₂H₅)C₄H₉))benzothiazolyl | H |
| f-7 | 2-(6-(SO₂NHCH₂CH(C₂H₅)C₄H₉))benzothiazolyl | —CH₂CH₂CH₃ |

-continued

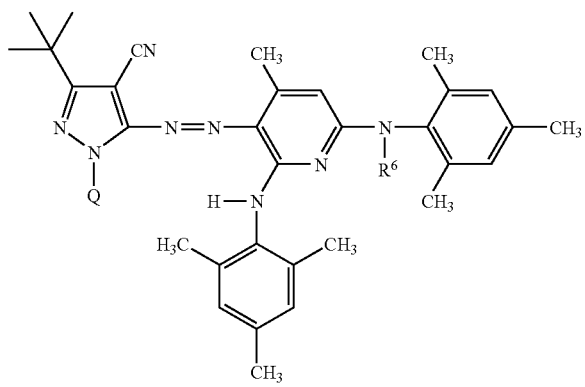

| Dye | Q | R⁶ |
|---|---|---|
| f-8 | 2-methylbenzothiazol-6-yl-SO₂NH-CH₂CH(C₂H₅)CH₂CH₂CH₂CH₃ | —CH₂CH(CH₂CH₃)CH₂CH₂CH₂CH₃ |
| f-9 | 2-methylbenzothiazol-6-yl-SO₂NH-CH₂CH(C₂H₅)CH₂CH₂CH₂CH₃ | 2-methylbenzothiazol-6-yl-SO₂NH-CH₂CH(C₂H₅)CH₂CH₂CH₂CH₃ |
| f-10 | 2-methylbenzothiazole | —CH₂CH(CH₂CH₃)CH₂CH₂CH₂CH₃ |
| f-11 | 2-chloro-3-cyano-4,6-dimethylpyridine | 2-methylbenzothiazol-6-yl-SO₂NH-CH₂CH(C₂H₅)CH₂CH₂CH₂CH₃ |
| f-12 | 2-chloro-3-cyano-4,6-dimethylpyridine | 3-cyano-4,6-dimethyl-2-(2-ethylhexylamino)pyridine |
| f-13 | 3-cyano-4,6-dimethyl-2-(2-ethylhexylamino)pyridine | 3-cyano-4,6-dimethyl-2-(2-ethylhexylamino)pyridine |

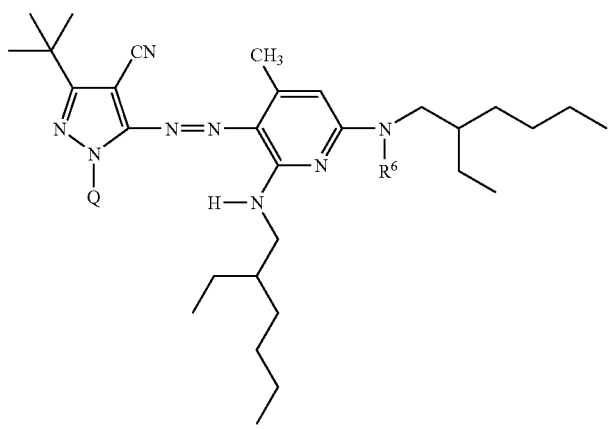
| Dye | Q | R⁶ |
|---|---|---|
| f-14 | 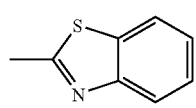 | H |
| f-15 | 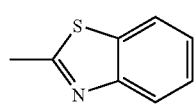 | —CH$_2$CH$_3$ |
| f-16 | 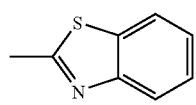 | —CH$_2$CH(CH$_2$CH$_3$)CH$_2$CH$_2$CH$_3$ |
| f-17 | 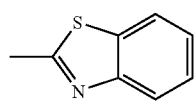 | 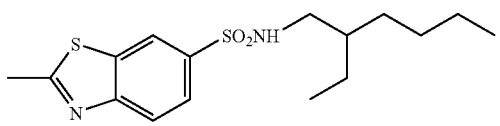 |
| f-18 | 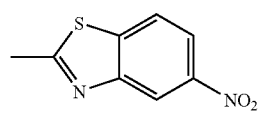 | 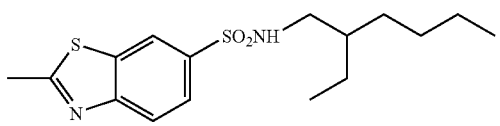 |
| f-19 | 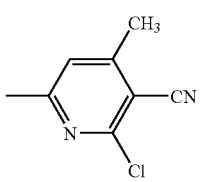 | 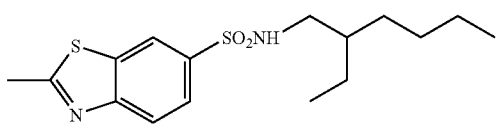 |
| f-20 | 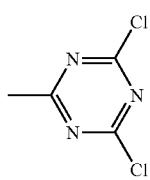 | 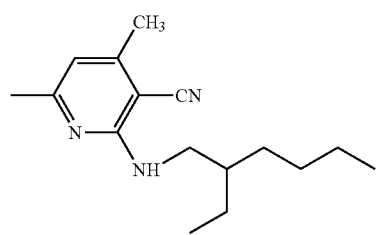 |

-continued
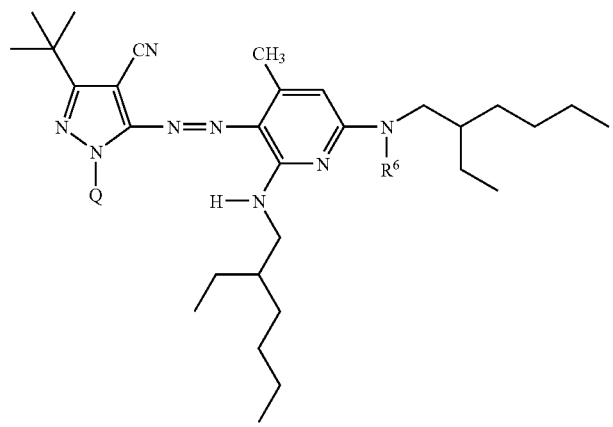
| Dye | Q | R⁶ |
|---|---|---|
| f-21 | 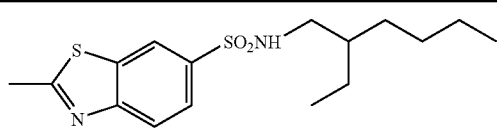 | |
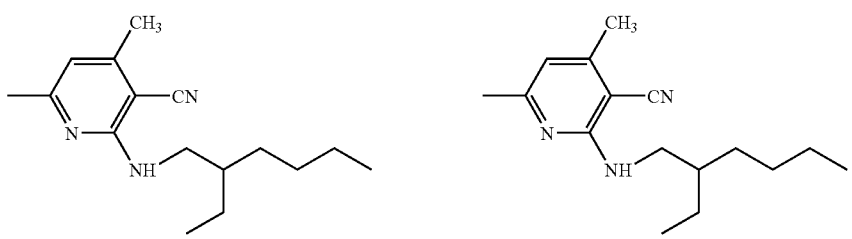
| Dye | R¹ | R² |
|---|---|---|
| f-22 | 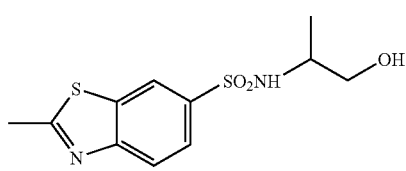 | H |
| f-23 | | 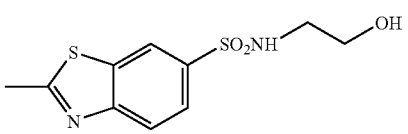 |

-continued

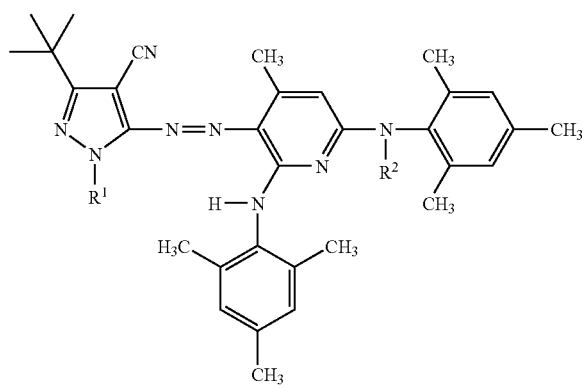

| Dye | R¹ | R² |
|---|---|---|
| f-24 | ![structure] 2-methylbenzothiazole-6-SO₂NH-C(CH₃)₂CH₂OH | 2-methylbenzothiazole-6-SO₂NH-C(CH₃)₂CH₂OH |
| f-25 | 2-methylbenzothiazole-6-SO₂NH-C(CH₂OH)₂CH₃ | 2-methylbenzothiazole-6-SO₂NH-C(CH₂OH)₂CH₃ |
| f-26 | 2-methylbenzothiazole | —CH₂CH(CH₂CH₃)CH₂CH₂CH₂CH₃ |
| f-27 | 2-chloro-4,6-dimethyl-3-cyanopyridine | 2-methylbenzothiazole-6-SO₂NH-CH₂CH(C₂H₅)C₄H₉ |
| f-28 | 2-chloro-4,6-dimethyl-3-cyanopyridine | 2-(2-ethylhexylamino)-4,6-dimethyl-3-cyanopyridine |
| f-29 | 2-(2-ethylhexylamino)-4,6-dimethyl-3-cyanopyridine | 2-(2-ethylhexylamino)-4,6-dimethyl-3-cyanopyridine |

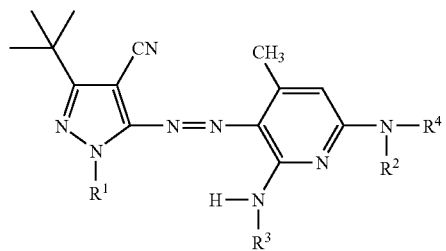

| Dye | R¹ | R² | R³ | R⁴ |
|---|---|---|---|---|
| f-30 | 2-methylbenzothiazol-yl | H | 3,4,5-trimethylphenyl | 2,4,6-trimethyl-3-SO₃Na-phenyl |
| f-31 | 2-methylbenzothiazol-yl | 2-methylbenzothiazol-yl | 3,4,5-trimethylphenyl | 2,4,6-trimethyl-3-SO₃Na-phenyl |
| f-32 | 2-methylbenzothiazol-yl | 2-methylbenzothiazol-yl | 2,4,6-trimethyl-3-SO₃Na-phenyl | 2,4,6-trimethylphenyl |
| f-33 | 2-methylbenzothiazol-6-SO₃Na-yl | 2-methylbenzothiazol-yl | 2,4,6-trimethyl-3-SO₃Na-phenyl | 2,4,6-trimethylphenyl |

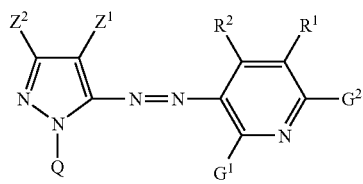

| Dye | Q | $Z^2$ | $Z^1$ | $R^2$ | $R^1$ | $G^1$ | $G^2$ |
|---|---|---|---|---|---|---|---|
| g-1 | 4-nitrophenyl | —C₄H₉(t) | —CN | —CH₃ | —CN | —NHCH₂CH(OH)CH₃ | —NHCH₂CH(OH)CH₃ |
| g-2 | 2-nitrophenyl | —C₄H₉(t) | —CN | —CH₃ | —CN | —NHCH₂CH(OH)CH₃ | —NHCH₂CH(OH)CH₃ |

-continued

Structure: Pyrazole ring with $Z^2$ at position 3, $Z^1$ at position 4, N-Q at position 1, connected via N=N azo linkage to pyridine ring with $R^2$, $R^1$, $G^2$, $G^1$ substituents.

| Dye | Q | $Z^2$ | $Z^1$ | $R^2$ | $R^1$ | $G^1$ | $G^2$ |
|---|---|---|---|---|---|---|---|
| g-3 | 4-NO$_2$-C$_6$H$_4$– | –C$_4$H$_9$(t) | –CN | –CH$_3$ | –CN | –N(CH$_3$)CH$_2$CH$_2$OH | –NHCH$_2$CH$_2$OH |
| g-4 | 4-NO$_2$-C$_6$H$_4$– | –C$_4$H$_9$(t) | –CN | –CH$_3$ | –CN | –NHCH$_2$CH$_2$OH | –N(CH$_3$)CH$_2$CH$_2$OH |
| g-5 | 4-NO$_2$-C$_6$H$_4$– | –C$_4$H$_9$(t) | –CN | –CH$_3$ | –CN | –NHCH$_2$CH$_2$OCH$_3$ | –NHCH$_2$CH$_2$OCH$_3$ |
| g-6 | 4-NO$_2$-C$_6$H$_4$– | –C$_4$H$_9$(t) | –CN | –CH$_3$ | –CN | –NHCH(OH)CH$_2$OH | –NHCH(OH)CH$_2$OH |
| g-7 | 4-COOH-3-NO$_2$-C$_6$H$_3$– | –C$_4$H$_9$(t) | –CN | –CH$_3$ | –CN | –NHCH(CH$_3$)CH$_2$OH | –NHCH$_2$CH(OH)$_2$ |

| Dye | Q | $Z^2$ | $Z^1$ | $R^2$ | $R^1$ | $G^1$ |
|---|---|---|---|---|---|---|
| g-8 | –CH$_2$CH(C$_2$H$_5$)C$_4$H$_9$ | –H | –CN | –CH$_3$ | –CN | –NHCH$_2$CH(OH)CH$_3$ |
| g-9 | 2-NO$_2$-C$_6$H$_4$– | –H | –CN | –CH$_3$ | –CN | –NHCH$_2$CH$_2$CH$_2$OCH$_2$CH(C$_2$H$_5$)C$_4$H$_9$ |
| g-10 | 2-NO$_2$-C$_6$H$_4$– | –C$_4$H$_9$ | –CN | –CH$_3$ | –CN | –NHCH$_2$CH$_2$CH$_2$OCH$_2$CH(C$_2$H$_5$)C$_4$H$_9$ |
| g-11 | 4-NO$_2$-C$_6$H$_4$– | –C$_3$H$_7$ | –COC$_2$H$_5$ (C(=O)OC$_2$H$_5$) | –CH$_3$ | –CN | –NHCH$_2$CH(OH)CH$_3$ |

-continued

| Dye | Q | | | | G² |
|---|---|---|---|---|---|
| g-12 | 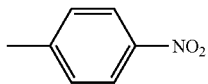 4-nitrophenyl | —C₄H₉ | —CN | —CH₃ —CN | 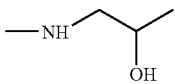 —NH-CH₂-CH(OH)-CH₃ |
| g-13 | 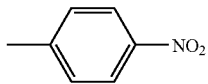 4-nitrophenyl | —C₄H₉(t) | —CN | —CH₃ —CN | 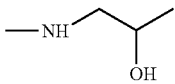 —NH-CH₂-CH(OH)-CH₃ |

| Dye | G² |
|---|---|
| g-8 | 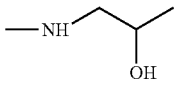 —NH-CH₂-CH(OH)-CH₃ |
| g-9 | 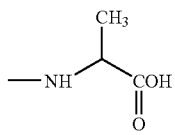 —NH-CH(CH₃)-COOH |
| g-10 | 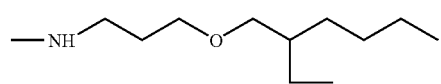 —NH-CH₂CH₂CH₂-O-CH₂-CH(C₂H₅)-C₄H₉ |
| g-11 | 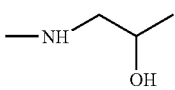 —NH-CH₂-CH(OH)-CH₃ |
| g-12 | 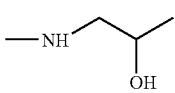 —NH-CH₂-CH(OH)-CH₃ |
| g-13 | 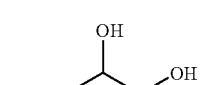 —NH-CH(OH)-CH₂OH (with OH) |

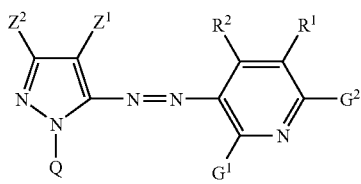

| Dye | Q | Z² | Z¹ | R² | R¹ | G¹ | G² |
|---|---|---|---|---|---|---|---|
| g-14 | 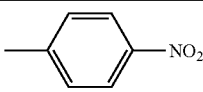 4-nitrophenyl | —C₂H₅ | —CN | —CH₃ | —CN | 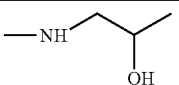 —NH-CH₂-CH(OH)-CH₃ | 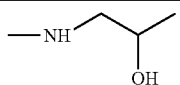 —NH-CH₂-CH(OH)-CH₃ |
| g-15 | 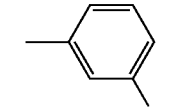 3-nitrophenyl | —C₂H₅ | —CN | —CH₃ | —CN | 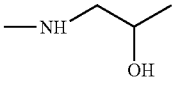 —NH-CH₂-CH(OH)-CH₃ | 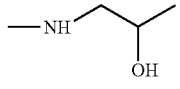 —NH-CH₂-CH(OH)-CH₃ |
| g-16 | 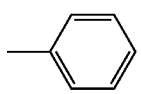 phenyl | —CH₃ | —CN | —CH₃ | —CN | 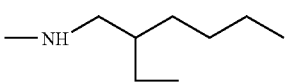 —NH-CH₂-CH(C₂H₅)-C₄H₉ | 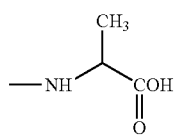 —NH-CH(CH₃)-COOH |

-continued

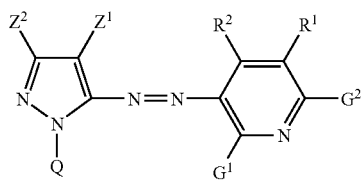

| Dye | Q | Z² | Z¹ | R² | R¹ | G¹ | G² |
|---|---|---|---|---|---|---|---|
| g-17 | 3-COOH-phenyl | —H | —CN | —CH₃ | —CN | —NH-CH₂-CH(C₂H₅)-C₄H₉ (2-ethylhexylamino) | —NHCH₃ |
| g-18 | 2-methyl-3-COOH-5-NO₂-phenyl | —C₄H₉(t) | —CN | —CH₃ | —CN | —NH-CH(CH₃)C₂H₅ (sec-butylamino) | —NH-CH(CH₃)C₂H₅ |
| g-19 | phenyl | —CH₃ | —CN | —CH₃ | —CN | —NH-CH₂-CH(OH)-CH₃ | —NH-CH₂CH₂-N(CH₃)₂ |

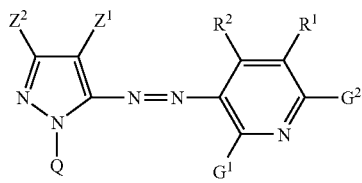

| Dye | Q | Z² | Z¹ | R² | R¹ | G¹ | G² |
|---|---|---|---|---|---|---|---|
| g-20 | phenyl | —H | —CN | —CH₃ | —CN | —NH-CH₂-CH(OH)-CH₃ | —NH-CH₂-CH(OH)-CH₃ |
| g-21 | 4-NO₂-phenyl | —H | —CN | —CH₃ | —CN | —NH-CH₂-CH(OH)-CH₃ | —NH-CH₂-CH(OH)-CH₃ |
| g-22 | —H | —C₄H₉(t) | —CN | —CH₃ | —CN | —NH-CH₂-CH(OH)-CH₃ | —NH-CH₂-CH(OH)-CH₃ |
| g-23 | phenyl | —H | —SO₂CH₃ | —CH₃ | —CN | —NH-CH₂-CH(C₂H₅)-C₄H₉ | —NH-CH(CH₃)-COOH |
| g-24 | phenyl | —CH₃ | —SO₂CH₃ | —CH₃ | —CN | —NH-CH₂-CH(OH)-CH₃ | —NH-phenyl |
| g-25 | 4-NO₂-phenyl | —C₄H₉(t) | —SO₂CH₃ | —CH₃ | —CN | —NH-CH₂-CH(OH)-CH₃ | —NH-CH₂-CH(OH)-CH₃ |

-continued

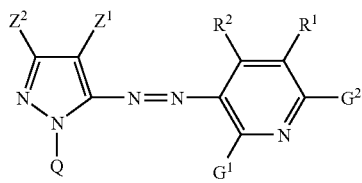

| Dye | Q | Z² | Z¹ | R² | R¹ | G¹ | G² |
|---|---|---|---|---|---|---|---|
| g-26 | phenyl | —CH₃ | —C(=O)N(CH₃)₂ | —CH₃ | —CN | —NHCH₂CH(OH)CH₃ | —NHCH₂CH(OH)CH₃ |

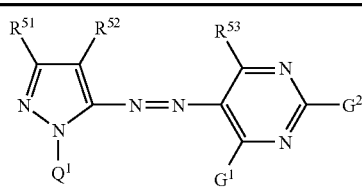

| Dye | Q¹ | R⁵¹ | R⁵² | R⁵³ | G¹ | G² |
|---|---|---|---|---|---|---|
| g-27 | 4-nitrophenyl | —C₄H₉(t) | —CN | —CH₃ | —NHCH₂CH(OH)CH₃ | —NHCH₂CH(OH)CH₃ |
| g-28 | 4-nitrophenyl | —C₄H₉(t) | —CN | —NHCH₂CH(OH)CH₃ | —NHCH₂CH(OH)CH₃ | —NHCH₂CH(OH)CH₃ |
| g-29 | phenyl | —H | —CN | —NHCH₂CH(OH)CH₃ | —NHCH₂CH(OH)CH₃ | —NHCH₂CH(C₂H₅)C₄H₉ |

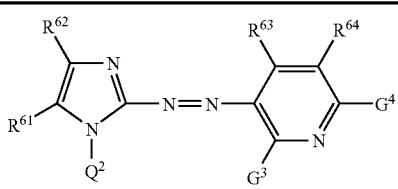

| Dye | Q² | R⁶¹ | R⁶² | R⁶³ | R⁶⁴ | G³ |
|---|---|---|---|---|---|---|
| g-30 | —C₈H₁₇ | —CN | —CN | —CH₃ | —CN | —NHCH₂CH(OH)CH₃ |
| g-31 | 4-nitrophenyl | —H | —H | —CH₃ | —CN | —NHCH₂CH₂CH₂OCH₂CH(C₂H₅)C₄H₉ |
| g-32 | —CH₃ | —CN | —CN | —CH₃ | —H | —NHCH₂CH(OH)CH₃ |

-continued
| | | | | | |
|---|---|---|---|---|---|
| g-33 | 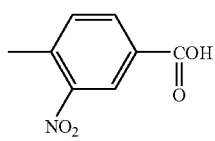 | —CN | —CN | —CH₃ | —H | 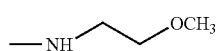 |
| Dye | G⁴ |
|---|---|
| g-30 | 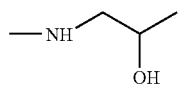 |
| g-31 | 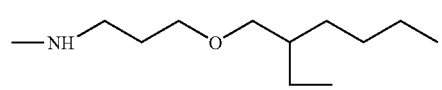 |
| g-32 | 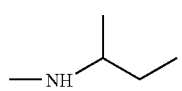 |
| g-33 | 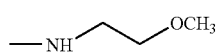 |
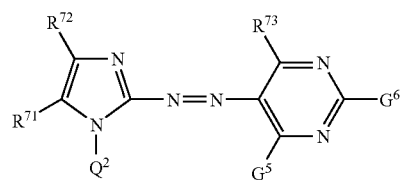
| Dye | Q³ | R⁷¹ | R⁷² | R⁷³ | G⁵ | G⁶ |
|---|---|---|---|---|---|---|
| g-34 | —C₈H₁₇ | —CN | —CN | 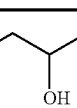 | 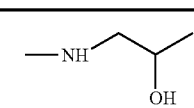 | 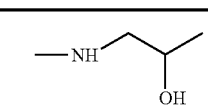 |
| g-35 | —C₈H₁₇ |  | 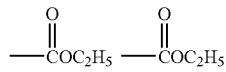 | —NH⌒OCH₃ | —NH⌒OCH₃ | —NH⌒OCH₃ |
| g-36 | 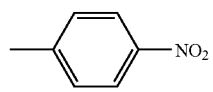 | —H | —H | 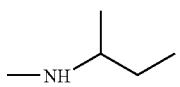 | 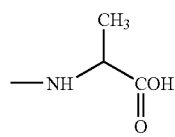 | 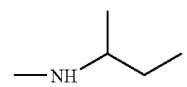 |
| g-37 | 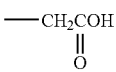 | —CN | —CN | 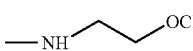 | 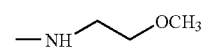 | 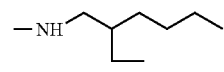 |

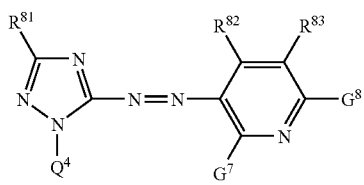

| Dye | Q⁴ | R⁸¹ | R⁸² | R⁸³ | G⁷ | G⁸ |
|---|---|---|---|---|---|---|
| g-38 | 4-NO₂-C₆H₄– | —H | —CH₃ | —CN | —NHCH₂CH(C₂H₅)C₄H₉ | —NHCH₂CH(C₂H₅)C₄H₉ |
| g-39 | 2-NO₂-C₆H₄– | —H | —CH₃ | —CN | —NHCH₂CH₂OCH₂CH(C₂H₅)C₄H₉ | —NHCH₂CH₂OCH₂CH(C₂H₅)C₄H₉ |
| g-40 | 4-NO₂-C₆H₄– | —H | —CH₃ | —CN | —NHCH₂CH₂OCH₂CH(C₂H₅)C₄H₉ | —NHCH₂CH₂OCH₂CH(C₂H₅)C₄H₉ |
| g-41 | 4-NO₂-C₆H₄– | —CH₃ | —CH₃ | —CN | —NHCH₂CH(OH)CH₃ | —NHCH₂CH(OH)CH₃ |
| g-42 | 4-NO₂-C₆H₄– | —C₆H₅ | —CH₃ | —H | —NHCH(CH₃)COOH | —NHCH(CH₃)C₂H₅ |
| g-43 | 4-NO₂-C₆H₄– | —H | —CH₃ | —CN | —NHCH₂CH(OH)CH₃ | —NHCH₂CH₂N(CH₃)₂ |

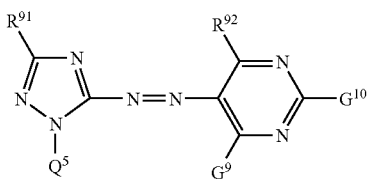

| Dye | Q⁵ | R⁹¹ | R⁹² | G⁹ | G¹⁰ |
|---|---|---|---|---|---|
| g-44 | C₆H₅– | —H | —NHCH₂CH(OH)CH₃ | —NHCH₂CH(OH)CH₃ | —NHCH₂CH(OH)CH₃ |
| g-45 | 4-NO₂-C₆H₄– | —H | —NHCH₂CH(OH)CH₃ | —NHCH₂CH(OH)CH₃ | —NHCH(CH₃)C₂H₅ |
| g-46 | 4-NO₂-C₆H₄– | —CH₃ | —NHCH₂CH(OCH₃)CH₃ | —NHCH₂CH(OCH₃)CH₃ | —NHCH₂CH(OCH₃)CH₃ |

-continued

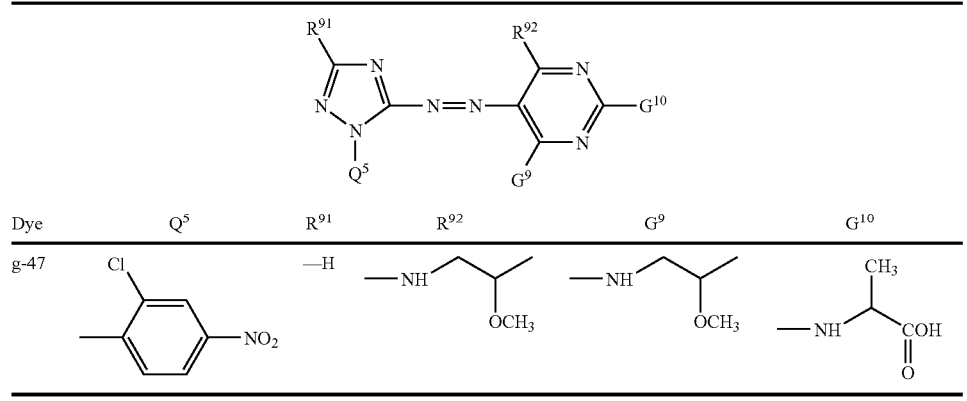

| Dye | $Q^5$ | $R^{91}$ | $R^{92}$ | $G^9$ | $G^{10}$ |
|---|---|---|---|---|---|
| g-47 | 2-Cl-4-NO$_2$-tolyl | —H | —NH—CH$_2$CH(OCH$_3$)CH$_3$ | —NH—CH$_2$CH(OCH$_3$)CH$_3$ | —NH—CH(CH$_3$)COOH |

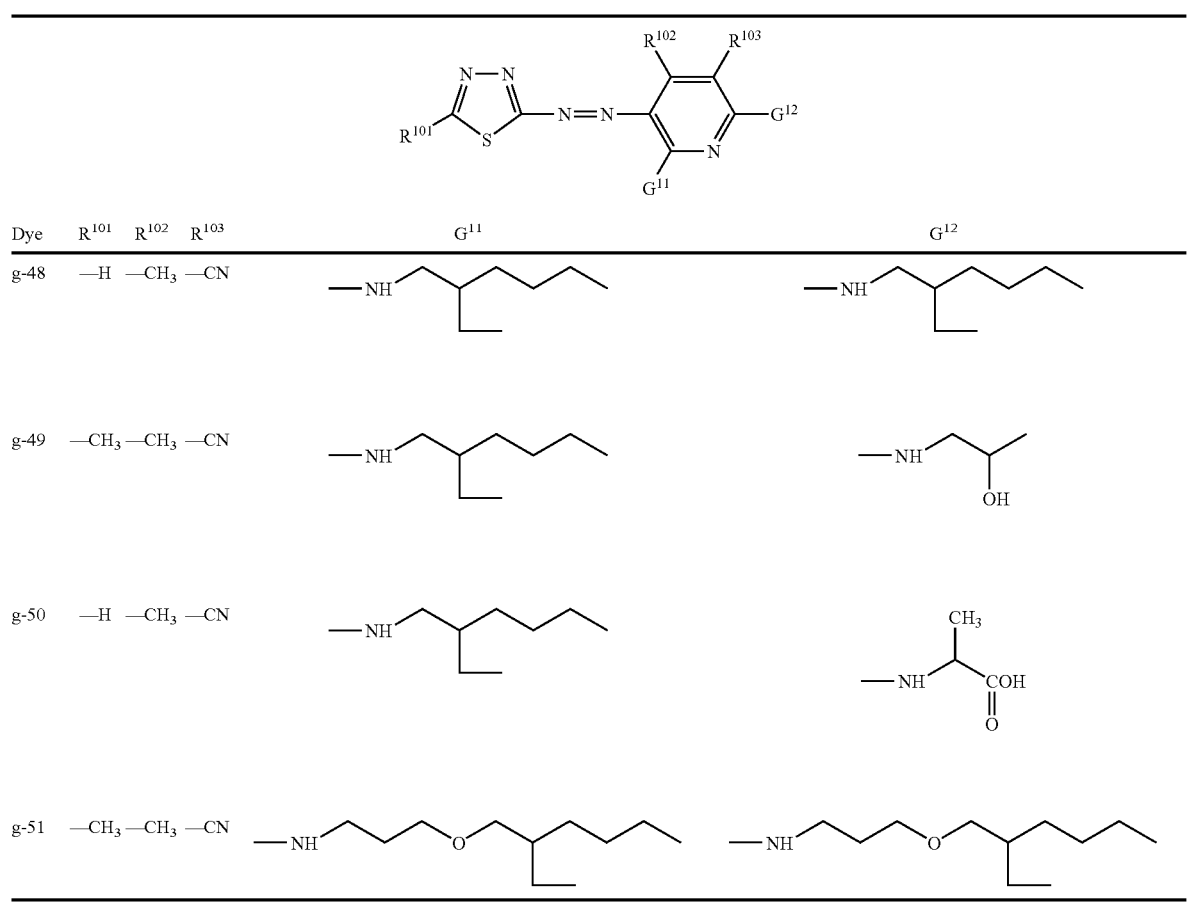

| Dye | $R^{101}$ | $R^{102}$ | $R^{103}$ | $G^{11}$ | $G^{12}$ |
|---|---|---|---|---|---|
| g-48 | —H | —CH$_3$ | —CN | —NH—CH$_2$CH(C$_2$H$_5$)C$_4$H$_9$ | —NH—CH$_2$CH(C$_2$H$_5$)C$_4$H$_9$ |
| g-49 | —CH$_3$ | —CH$_3$ | —CN | —NH—CH$_2$CH(C$_2$H$_5$)C$_4$H$_9$ | —NH—CH$_2$CH(OH)CH$_3$ |
| g-50 | —H | —CH$_3$ | —CN | —NH—CH$_2$CH(C$_2$H$_5$)C$_4$H$_9$ | —NH—CH(CH$_3$)COOH |
| g-51 | —CH$_3$ | —CH$_3$ | —CN | —NH—(CH$_2$)$_3$—O—CH$_2$CH(C$_2$H$_5$)C$_4$H$_9$ | —NH—(CH$_2$)$_3$—O—CH$_2$CH(C$_2$H$_5$)C$_4$H$_9$ |

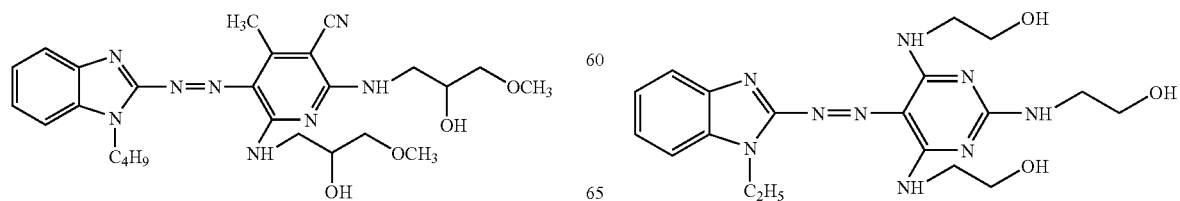

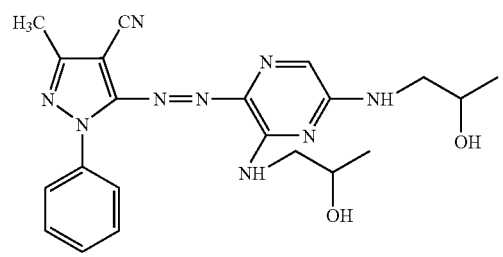
(g-54)
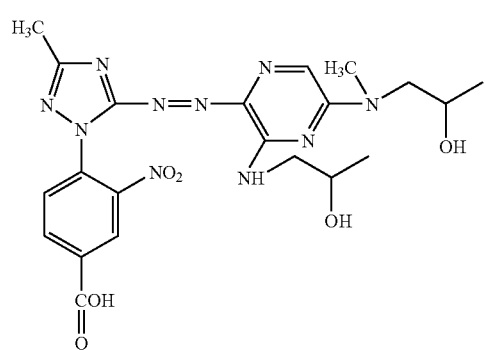
(g-55)
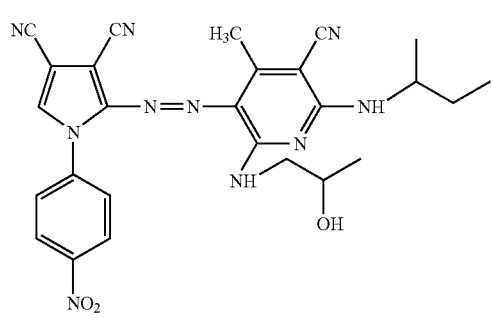
(g-56)
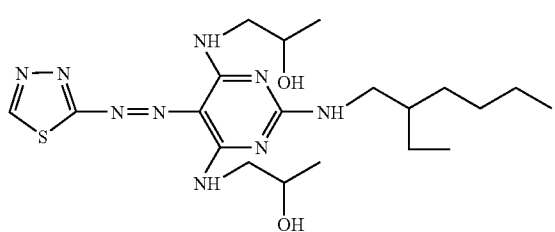
(g-57)
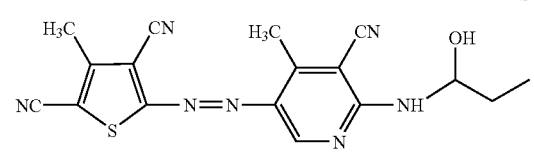
(g-58)
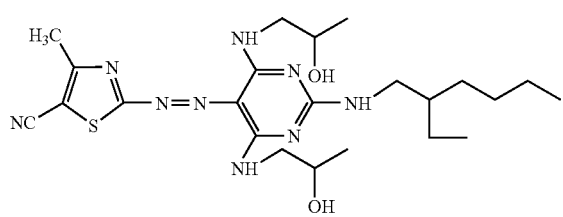
(g-59)
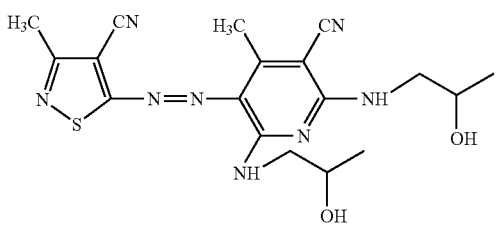
(g-60)
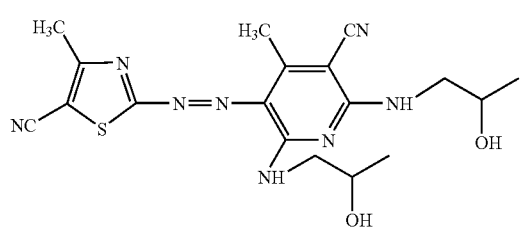
(g-61)
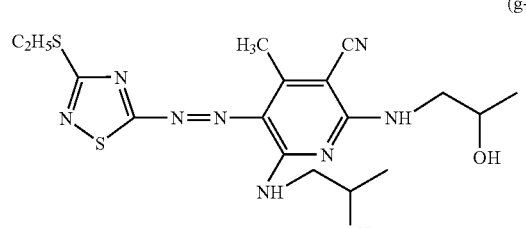
(g-62)
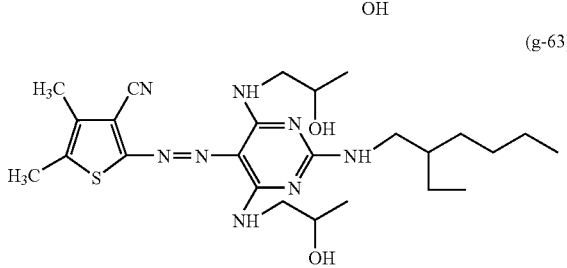
(g-63)
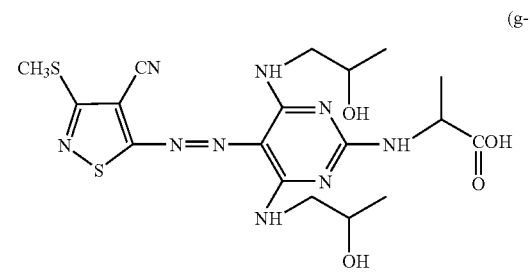
(g-64)
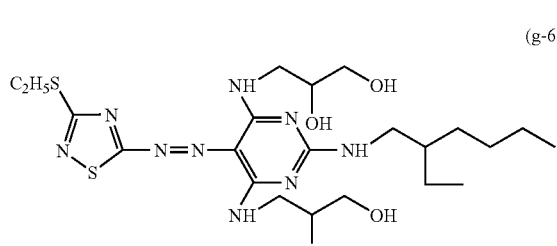
(g-65)
Next, detailed explanations will be furnished as to synthetic examples of the azo dye represented by the formula (1).

SYNTHETIC EXAMPLE 1

Synthesis of an Azo Dye a-1 (Exemplified Compound)

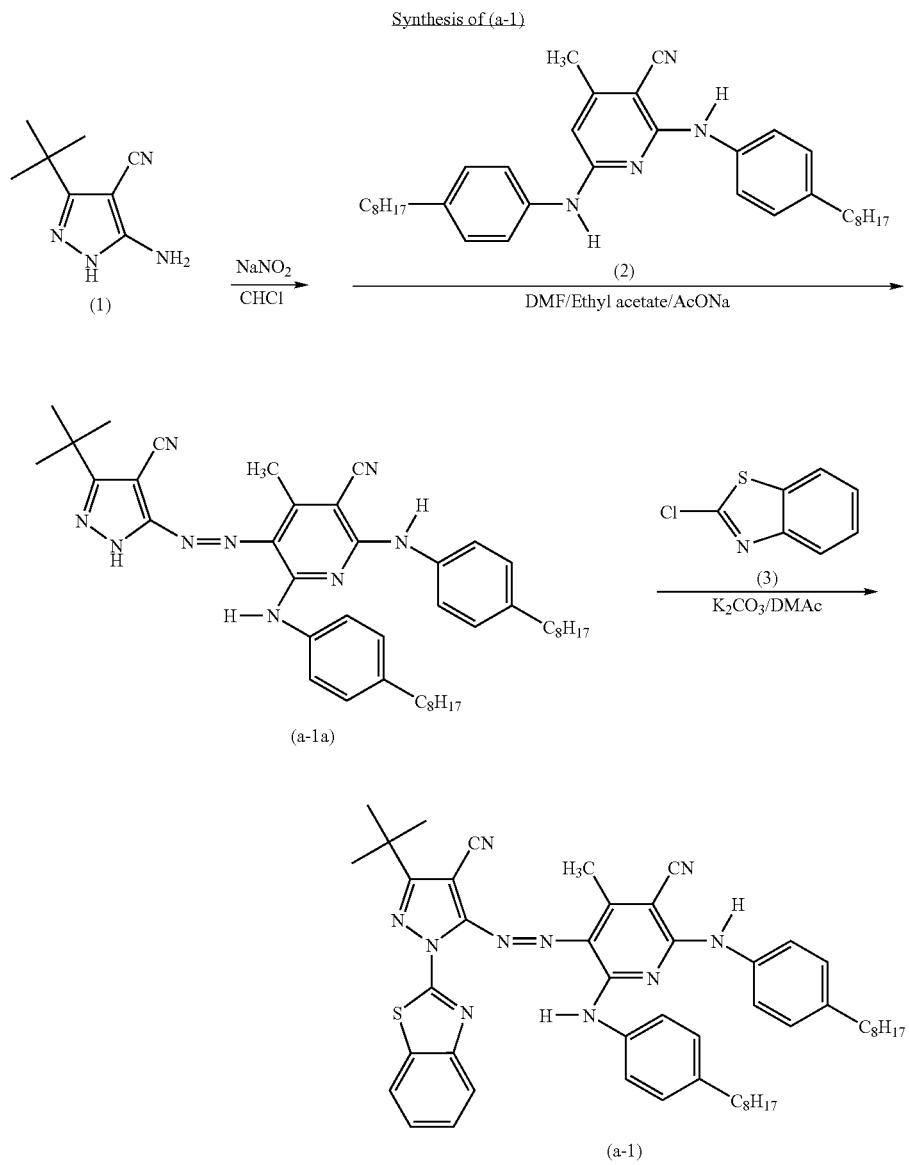

<Synthesis of an Intermediate (a-1a)>

8 g (48.7 mmol) of 5-amino-3-tert-butyl-4-cyanopyrazole (1), 15 ml of concentrated hydrochloric acid and 50 ml of water were stirred at an internal temperature of 5° C. 3.36 g (48.7 mmol) of sodium nitrite was added to the mixture in lots for 10 minutes and the resulting mixture was stirred for 10 minutes as it was. Then, a diazonium salt was added to the mixture over 10 minutes which salt was prepared by adding 50 g of sodium acetate, 50 ml of DMF (dimethylformamide) and 50 ml of ethyl acetate to 21.3 g (40.6 mmol) of a coupling component (2) and by stirring the mixture and allowing the mixture to cool at an internal temperature of 5° C. in a three-neck flask. After the diazonium salt was added, the reaction solution was stirred for 30 minutes as it was. Then, 300 ml of saturated brine was added to the reaction solution and the precipitated crystals (intermediate (a-1a)) were separated by filtration (yield: 24.2 g (85%)).

<Synthesis of an Azo Dye (a-1)>

4.4 g (26 mmol) of a heteryl agent (3), 2.8 g of potassium carbonate and 50 ml of DMAc were added to 14.0 g (20 mmol) of the resulting intermediate (a-1a). The mixture was heated with stirring at 10° C. for one hour. After the reaction was completed, the reaction solution was cooled to ambient temperature. 200 ml of saturated brine was added to the solution and the precipitated crude crystals (azo dye a-1) were separated by filtration. Moreover, the crude crystals were recrystallized from acetonitrile (yield: 16.7 g (80%)). The maximum absorption wavelength $\lambda_{max}$ measured by a spectrophotometer UV-2500 PC (manufactured by Shimadzu Corporation) of the synthesized azo dye a-1 was 545 nm (DMF solution) and m/z (posi) was 834.

SYNTHETIC EXAMPLE 2

Synthesis of an Azo Dye b-1 (Exemplified Compound)

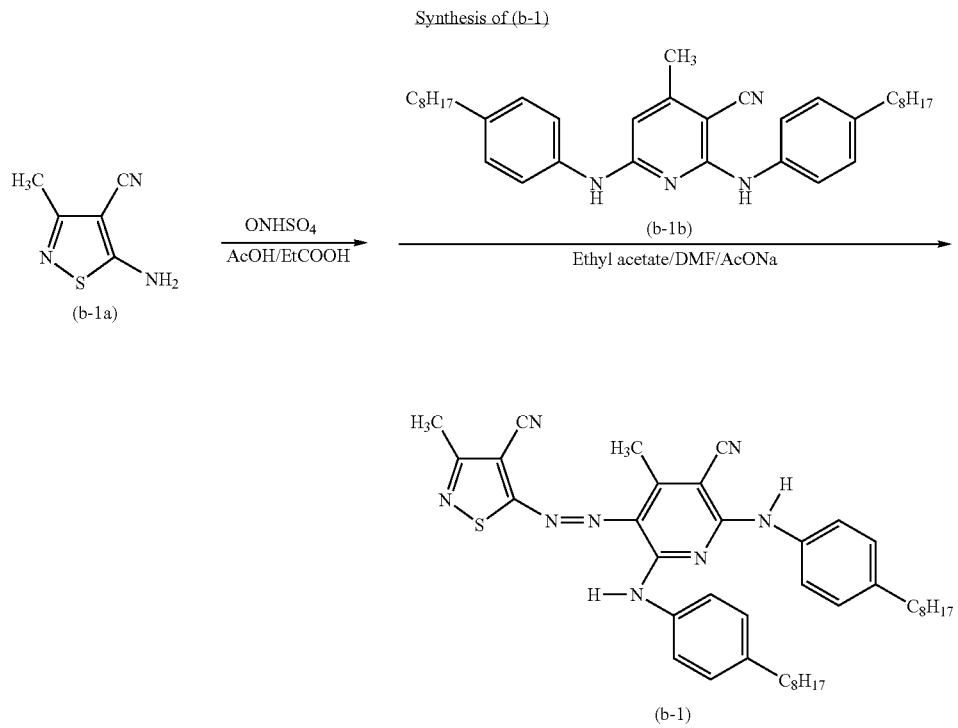

1 g of the compound (b-1a) was dispersed in 3.8 ml of a solvent mixture of acetic acid/propionic acid (2/3 (v/v)) and the dispersion solution was cooled to 0° C. Then, 2.21 g of a nitrosyl sulfuric acid (41% solution) was added gradually to the dispersion solution, which was then stirred for one hour to obtain a diazo solution. Meanwhile, 1.05 g of the compound (b-1b) was dissolved in a solvent mixture of 14 ml of dimethylformamide and 6 ml of ethyl acetate and 2.5 g of sodium acetate was added to the solution, which was then cooled to 0° C. to obtain a suspension. The diazo solution was gradually added dropwise to the resulting suspension. After the dropwise addition was finished, the mixture was reacted for further two hours. After the reaction was finished, water was added to the reaction solution to precipitate crystals, which were then filtered and then purified by silica gel column chromatography to obtain 750 mg of a crystal product (azo dye b-1). The yield and maximum absorption wavelength $\lambda_{max}$ (spectrophotometer UV-2500PC, manufactured by Shimadzu Corporation) were 57.7% and 545 nm respectively.

SYNTHETIC EXAMPLE 3

Synthesis of an Azo Dye b-6 (Exemplified Compound)

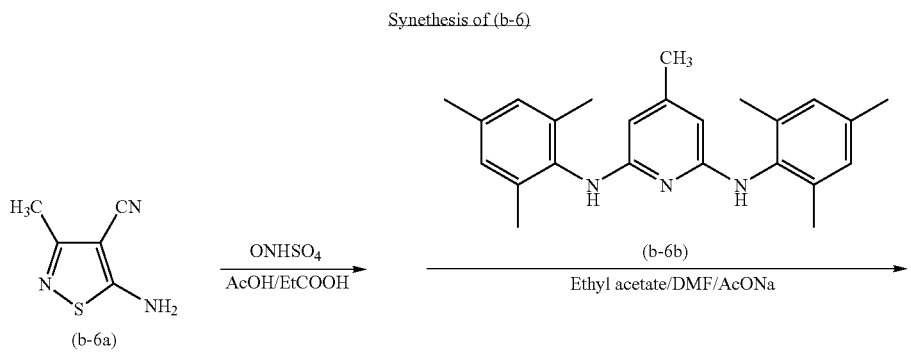

-continued

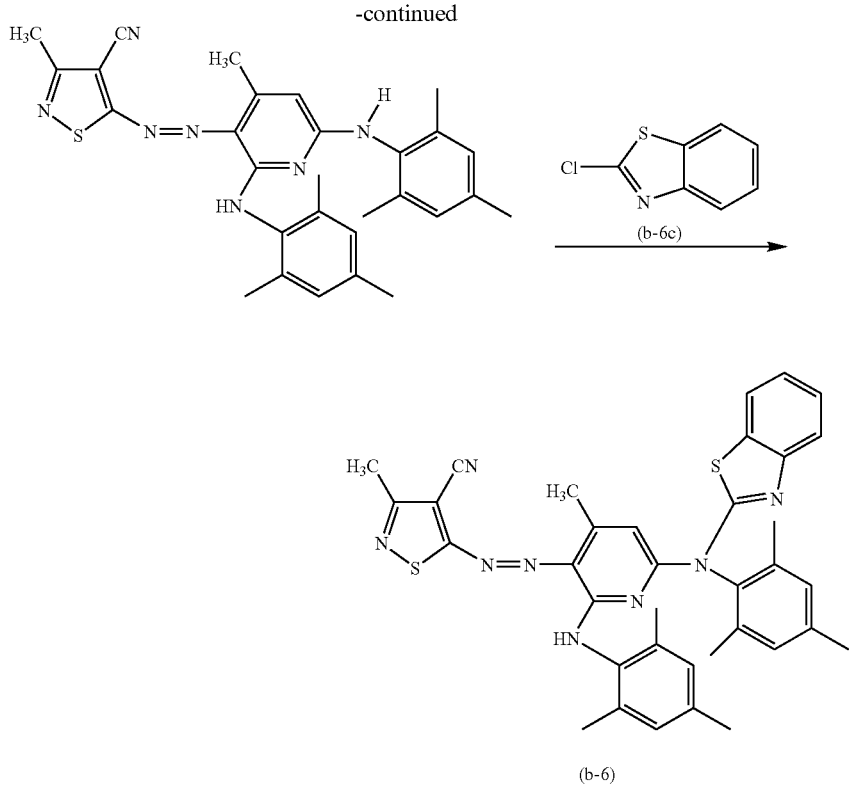

1 g of the compound (b-6a) was dispersed in 3.8 ml of a solvent mixture of acetic acid/propionic acid (2/3 (v/v)) and the dispersion solution was cooled to 0° C. Then, 2.21 g of a nitrosyl sulfuric acid (41% solution) was added gradually to the dispersion solution, which was then stirred for one hour to obtain a diazo solution. Meanwhile, 1.0 g of the compound (b-6b) was dissolved in a solvent mixture of 15 ml of dimethylformamide and 5 ml of ethyl acetate and 2.5 g of sodium acetate was further added to the solution, which was then cooled to 0° C. to obtain a suspension. The diazo solution was gradually added dropwise to the resulting suspension. After the dropwise addition was finished, the mixture was further reacted for two hours. After the reaction was finished, water was added to the reaction solution to precipitate crystals, which were then filtered to obtain crude crystals. The crude crystals were further dissolved in 10 ml of dimethylformamide, and 560 mg of potassium carbonate and 1.3 g of 2-chlorobenzothiazole (b-6c) were added and reacted with the solution at 110° C. for one hour. After the reaction was finished, water was added to the reaction solution to precipitate crude crystals, which were then filtered and then purified by silica gel column chromatography to obtain 700 mg of a crystal product (azo dye b-6). The yield and maximum absorption wavelength $\lambda_{max}$ (spectrophotometer UV-2500PC, manufactured by Shimadzu Corporation) were 58.6% and 550 nm respectively.

SYNTHETIC EXAMPLE 4

Synthesis of an Azo Dye g-1 (Exemplified Compound)

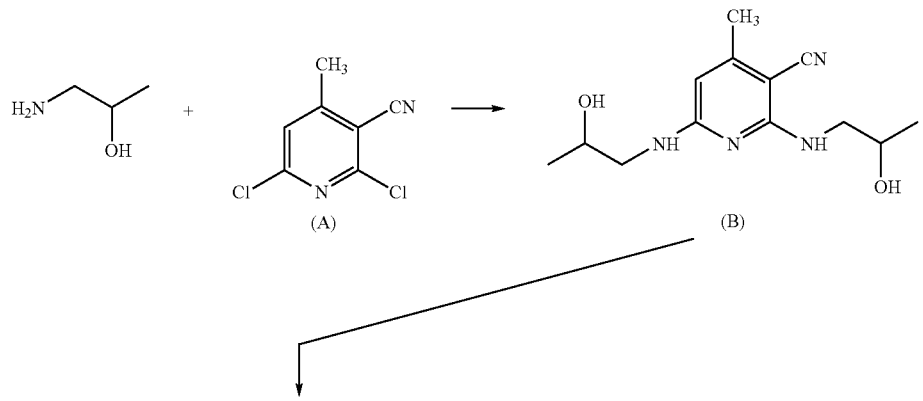

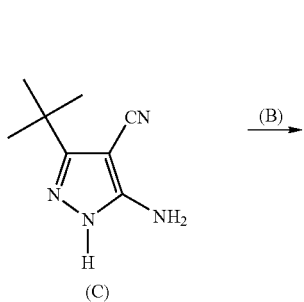 (B) → 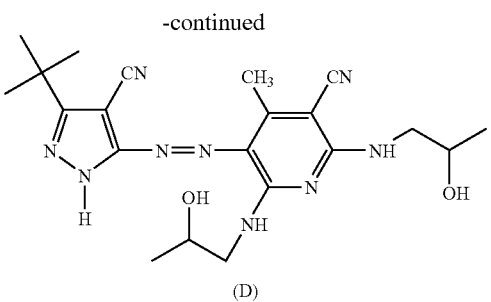 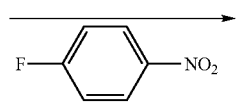

(C) (D)

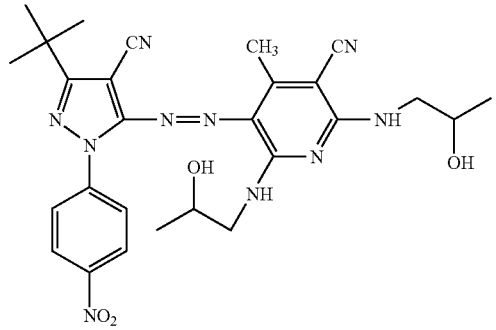

(g-1)

18.7 g (0.10 mol) of the compound (A) was added gradually to 45.0 g (0.60 mol) of 1-amino-2-propanol with stirring under water-cooling. Thereafter, the mixture was stirred at 120° C. for 3 hours. After the stirring, the temperature of the reaction solution was dropped to ambient temperature. 300 ml of ethyl acetate and 300 ml of water were added to the reaction solution to fractionate and the ethyl acetate phase was washed with 200 ml of saturated brine twice. After that, ethyl acetate was distilled under reduced pressure and the resulting viscous liquid was subjected to crystallization using 100 ml of acetonitrile to obtain 19.7 g of a compound (B) (yield: 74.6%).

A solution was separately prepared by dissolving 10.0 g (0.06 mol) of a compound (C) in a solution mixture (0.10 mol) of 35 ml of acetic acid and 8.5 ml of concentrated hydrochloric acid. To the solution was added a solution prepared by dissolving 4.3 g (0.062 mol) of sodium nitrite in 13 ml of water at 3° C. over 5 minutes with stirring and the resulting mixture was further stirred for 40 minutes to obtain a solution (a). Meanwhile, a solution was prepared by dissolving 16.0 g (0.06 mol) of the compound (B) obtained above in a solution mixture (0.33 mol) of 47 ml of N-methylpyrrolidone and 26.6 ml of pyridine. To this solution was added the above solution (a) at 10° C. over 20 minutes with stirring. Thereafter, the obtained solution was further stirred at 25° C. for 2 hours. 300 ml of water was added to the reaction solution and the resulting solution was stirred for one hour. The precipitated crystals were filtered and then thoroughly washed with water. The resulting crystals were dried to obtain 25.4 g of a compound (D) (yield: 96.2%).

30 ml of dimethylacetamide, 7.8 g (0.057 mol) of potassium carbonate and 4.4 g (0.031 mol) of p-fluoronitrobenzene were added to 12.5 g (0.028 mol) of the compound (D) and the mixture was stirred at 75° C. for two hours. The reaction solution was poured into a solution mixture of 100 ml of water and 100 ml of ethyl acetate to fractionate and the ethyl acetate phase was washed with 100 ml of saturated brine twice. Thereafter, ethyl acetate was distilled under reduced pressure and the residue was purified by silica gel column chromatography and was further subjected to crystallization using 70 ml of acetonitrile, followed by filtration. Then, these crystals were washed with 30 ml of cooled acetonitrile and dried to obtain 7.3 g of yellow crystal products (azo dye g-1). The yield and melting point of the crystal product were 46.5% and 200° C. or more respectively. The maximum absorption wavelength ($\lambda_{max}$)(spectrophotometer UV-2500PC, manufactured by Shimadzu Corporation) and molar extinction coefficient ($\epsilon$) in ethyl acetate were 499.1 nm and 34,500 [1·mol$^{-1}$·cm$^{-1}$] respectively.

The aforementioned other exemplified compounds may also be synthesized in the same manner as above by changing the above compound to a desired compound in accordance to a target azo dye.

The azo dyes (hereinafter also referred to as "dye according to the invention" represented by the formula (1) or (2) are preferably utilized for color filters which are used for recording and reproducing a color image and also used for producing solid state image pickup devices such as CCDs and CMOSs and displays such as LCDs and PDPs, or utilized for a curable composition used to manufacture these color filters.

The negative type color filter of the invention can be produced according to any method insofar as it has a structure which can include the azo dye (dye according to the present invention) represented by the formula (1) or (2). For instance, the negative type color filter of the invention can be preferably formed by, for example, preparing a curable composition containing the dye according to the invention, applying the prepared curable composition to a support, exposing the curable composition to light through a mask, and developing to remove the unexposed part, to thereby form a pattern image (this step is repeated a number of times corresponding to the number of desired hues constituting a color filter so as to obtain desired hues according to need).

The proportion of a solid content in the curable composition of the invention is preferably 3 to 60% by mass and more preferably 10 to 40% by mass. The amount of the dye according to the invention in the solid content (color filter) is preferably 3 to 90% by mass and more preferably 10 to 70% by mass. The proportion of the dye in the curable composition is preferably 0.1 to 50% by mass and more preferably 1 to 30% by mass.

The film thickness of the color filter of the invention is preferably 0.1 to 3 μm, more preferably 0.1 to 2 μm and particularly preferably 0.1 to 1.5 μm.

To state more specifically, the negative type color filter may be preferably manufactured in the following manner. Namely, a curable composition containing the dye according to the invention and constituted as a negative type is applied to a support by a coating method such as rotary coating, casting coating and roll coating to form a radiosensitive composition layer, which is then exposed to light through a predetermined mask pattern. After the exposure, the unexposed part is removed by developing using a developer to thereby form a negative type color pattern (image forming step). Also, according to need, it is possible to provide the curing step of curing the formed color pattern by heating and/or exposure to light. Then, the image forming step (involving the curing step according to need) is repeated a number of times corresponding to the number of desired hues whereby a negative type color filter having desired hues can be produced. As the light or radiation used in this case, particularly, ultraviolet rays such as a g-ray, h-ray and i-ray are preferably used.

Other components contained in the negative type color filter or curable composition of the invention will be explained.

(Binder)

The negative type color filter or the curable composition of the invention preferably includes at least one type of binder. No particular limitation is imposed on the binder according to the invention insofar as it is alkali-soluble. However, it is preferable to select the binder from the viewpoints of heat resistance, developing property and availability.

Linear organic high molecular weight polymers which are soluble in an organic solvent and can be developed in an aqueous weakly alkaline solution are preferably used as the binder. Examples of such linear organic high molecular weight polymers include polymers having a carboxylic acid on a side chain such as methacrylic acid copolymers, acrylic acid copolymers, itaconic acid copolymers, crotonic acid copolymers, maleic acid copolymers, partially esterified maleic acid copolymers and the like described in, for example, JP-A No. 59-44615, Japanese Patent Application Publication (JP-B) Nos. 54-34327, 58-12577, and 54-25957, and JP-A Nos. 59-53836 and 59-71048. Also, acidic cellulose derivatives having a carboxylic acid on a side chain may be used.

Other than the above-mentioned polymers, polymers obtained by adding an acid anhydride to a polymer having a hydroxy group, polyhydroxystyrene type resins, polysiloxane type resins, poly(2-hydroxyethyl(meth)acrylate), polyvinylpyrrolidone, polyethylene oxide, and polyvinyl alcohol may also be used.

Further, a monomer having hydrophilicity may be copolymerized to obtain the binder and examples of such monomers include alkoxyalkyl (meth)acrylate, hydroxyalkyl(meth)acrylate, glycerol (meth)acrylate, (meth)acrylamide, N-methylolacrylamide, secondary or tertiary alkylacrylamide, dialkylaminoalkyl(meth)acrylate, morpholine (meth)acrylate, N-vinylpyrrolidone, N-vinylcaprolactam, vinylimidazole, vinyltriazole, methyl(meth)acrylate, ethyl(meth)acrylate, branched or straight chain propyl(meth)acrylate, branched or straight chain butyl (meth)acrylate, phenoxyhydroxypropyl(meth)acrylate, and the like.

Additionally, with respect to the above-mentioned monomers having hydrophilicity, monomers having a tetrahydrofurfuryl group, phosphoric acid, phosphoric ester, quaternary ammonium salt, ethyleneoxy chain, propylene oxy chain, sulfonic acid and its salt, or morpholinoethyl group may be used.

Further, the binder may have a polymerizable group in a side chain for improving the crosslinking efficiency and a polymer having allyl group, (meth)acryl group, allyloxyalkyl group and the like in a side chain may also be used.

Hereinafter, polymers having one or more of these polymerizable groups will be exemplified, however they are not particularly limited to the following examples so long as they contain an alkali-soluble group such as COOH, OH and ammonium and an unsaturated bond between carbon atoms.

As specific examples, compounds obtained by reaction of a compound having an epoxy ring reactive on OH group and an unsaturated bond between carbon atoms (e.g. glycidyl acrylate), with a copolymer of an OH-group-containing monomer, e.g. 2-hydroxyethyl acrylate, a COOH-containing monomer, e.g. methacrylic acid, and a monomer of an acrylic or vinyl compound copolymerizable with these monomers can be used.

Those reactive on OH group may include compounds having an acid anhydride, isocyanate group, or acryloyl, other than epoxy ring. Also, reaction products obtained by reaction of a saturated or unsaturated polybasic acid anhydride with a compound obtained by reaction of an unsaturated carboxylic acid such as acrylic acid with a compound having an epoxy ring as described JP-A No. 6-102669 and 6-1938 can be used.

Examples of the compound having an alkali-soluble group such as COOH and an unsaturated bond between carbon atoms include Dianal NR series (manufactured by Mitsubishi Rayon Co., Ltd.); Photomer 6173 (COOH-containing Polyurethane Acrylic Oligomer manufactured by Daimond Shamrock Co., Ltd.); Viscoat R-264 and KS resist 106 (manufactured by Osaka Organic Chemical Industry Co., Ltd.); Cyclomer P series and Placcel CF 200 series (manufactured by Daicel Chem. Ind., Ltd.); and Ebecryl 3800 (manufactured by Daicel UCB Co., Ltd.).

Among the these binders, from a viewpoint of heat resistance, polyhydroxystyrene type resins, polysiloxane type resins, acrylic resins, acrylamide type resins, and acryl/acrylamide copolymer resins are preferable and acrylic resins, polyhydroxystyrene type resins, and polysiloxane type resins are further preferable. Also, from a viewpoint of developing property controlling, acrylic resins, acrylamide type resins, and acryl/acrylamide copolymer resins are preferable.

Preferable examples of the acrylic resins include copolymers made from monomers selected from the group consisting of benzyl (meth)acrylate, (meth)acrylic acid, hydroxyethyl(meth)acrylate, (meth)acrylamide and the like; Cyclomer P series and Placcel CF 200 series (manufactured by Daicel Chem. Ind., Ltd.); Ebecryl 3800 (manufactured by Daicel UCB Co., Ltd.); Dianal NR series (manufactured by Mitsubishi Rayon Co., Ltd.); and Viscoat R-264 and KS resist 106 (manufactured by Osaka Organic Chemical Industry Co., Ltd.).

The weight average molecular weight (the value on the basis of polystyrene measured by GPC method) of polymers as the above-mentioned binder is preferably 1,000 to $2 \times 10^5$, more preferably 2,000 to $1 \times 10^5$, and particularly preferably 5,000 to $5 \times 10^4$.

The content of the above-mentioned binder in the curable composition is preferably 10 to 90% by mass, more preferably 20 to 80% by mass, and particularly preferably 30 to 70% by mass in the entire solid components of the composition.

(Radiosensitive Compound)

The negative type color filter or the curable composition of the invention preferably includes at least one type of radiosensitive compound. The radiosensitive compound in the invention may cause chemical reactions such as radical generation, acid generation, and base generation by radiation beam such as UV, deep UV, visible light, IR, electron beam and the like. The radiosensitive compound is used for insolubilizing the above-mentioned alkali-soluble resins by crosslinking, polymerization, or acidic group decomposition reactions, or making a coating film insoluble in an alkaline developer by causing polymerization of the polymerizable monomers or oligomers or crosslinking by the crosslinking agents existing in the coating film.

When producing a negative type color filter by using the curable composition of the invention, the composition is preferable to include a photopolymerization initiator. The photopolymerization initiator is not particularly limited as long as it can cause polymerization reaction of a monomer having a polymerizable group and is preferably selected from the viewpoint of characteristics, initiating efficiency, absorption wavelength, availability, and the cost and the like.

Examples of the above-mentioned photo-polymerization initiator include at least one active halogen compound selected from a halomethyl oxadiazole compound and a halomethyl-s-triazine compound; a 3-aryl-substituted coumarin compound; a lophine dimer; a benzophenone compound; an acetophenone compound and derivatives thereof; a cyclopentadiene-benzene-iron complex and a salt thereof; and an oxime compound.

Examples of the active halogen compound that is a halomethyl oxadiazole compound include a 2-halomethyl-5-vinyl-1,3,4-oxadiazole compound and the like, described in JP-B No. 57-6096, 2-trichloromethyl-5-styryl-1,3,4-oxadiazole, 2-trichloromethyl-5-(p-cyanostyryl)-1,3,4-oxadiazole, 2-trichloromethyl-5-(p-methoxystyryl)-1,3,4-oxadiazole.

Examples of the active halogen compound that is a halomethyl-s-triazine compound include a vinyl-halomethyl-s-triazine compound disclosed in JP-B No. 59-1281, a 2-(naphtho-1-yl)-4,6-bis-halomethyl-s-triazine compound and a 4-(p-aminophenyl)-2,6-di-hallomethyl-s-triazine compound, described in JP-A No. 53-133428.

Specific examples include 2,4-bis(trichloromethyl)-6-p-methoxystyryl-s-triazine, 2,6-bis(trichloromethyl)-4-(3,4-methyleneoxy phenyl)-1,3,5-triazine, 2,6-bis(trichloromethyl)-4-(4-methoxyphenyl)-1,3,5-triazine, 2,4-bis(trichloromethyl)-6-(1-p-dimethylaminophenyl-1,3-butadienyl)-s-triazine, 2-trichloromethyl-4-amino-6-p-methoxystyryl-s-triazine, 2-(naphtho-1-yl)-4,6-bis-trichloromethyl-s-triazine, 2-(4-methoxy-naphtho-1-yl)-4,6-bis-trichloromethyl-s-triazine, 2-(4-methoxy-naphtho-1-yl)-4,6-bis-trichloromethyl-s-triazine, 2-(4-ethoxy-naphtho-1-yl)-4,6-bis-trichloromethyl-s-triazine, 2-(4-butoxy-naphtho-1-yl)-4,6-bis-trichloromethyl-s-triazine, 2-[4-(2-methoxyethyl)-naphtho-1-yl]-4,6-bis-trichloromethyl-s-triazine, 2-[4-(2-ethoxyethyl)-naphtho-1-yl]-4,6-bis-trichloromethyl-s-triazine, 2-[4-(2-butoxyethyl)-naphtho-1-yl]-4,6-bis-trichloromethyl-s-triazine, 2-(2-methoxy-naphtho-1-yl)-4,6-bis-trichloromethyl-s-triazine, 2-(6-methoxy-5-methyl-naphtho-2-yl)-4,6-bis-trichloromethyl-s-triazine, 2-(6-methoxy-naphtho-2-yl)-4,6-bis-trichloromethyl-s-triazine, 2-(5-methoxy-naphtho-1-yl)-4,6-bis-trichloromethyl-s-triazine, 2-(4,7-dimethoxy-naphtho-1-yl)-4,6-bis-trichloromethyl-s-triazine, 2-(6-ethoxy-naphtho-2-yl)-4,6-bis-trichloromethyl-s-triazine, 2-(4,5-dimethoxy-naphtho-1-yl)-4,6-bis-trichloromethyl-s-triazine, 4-[p-N,N-di(ethoxycarbonylmethyl)aminophenyl]-2,6-di(trichloromethyl)-s-triazine, 4-[o-methyl-p-N,N-di(ethoxycarbonylmethyl)aminophenyl]-2,6-di(trichloromethyl)-s-triazine, 4-[p-N,N-di(chloroethyl)aminophenyl]-2,6-di(trichloromethyl)-s-triazine, 4-[o-methyl-p-N,N-di(chloroethyl)aminophenyl]-2,6-di(trichloromethyl)-s-triazine, 4-(p-N-chloroethyl aminophenyl)-2,6-di(trichloromethyl)-s-triazine, 4-(p-N-ethoxycarbonylmethyl aminophenyl)-2,6-di(trichloromethyl)-s-triazine, 4-[p-N,N-di(phenyl)aminophenyl]-2,6-di(trichloromethyl)-s-triazine, 4-(p-N-chloroethylcarbonyl aminophenyl)-2,6-di(trichloromethyl)-s-triazine, 4-[p-N-(p-methoxyphenyl)carbonylaminophenyl]-2,6-di(trichloromethyl)-s-triazine, 4-[m-N,N-di(ethoxycarbonylmethyl)aminophenyl]-2,6-di(trichloromethyl)-s-triazine, 4-[m-bromo-p-N,N-di(ethoxycarbonylmethyl)aminophenyl]-2,6-di(trichloromethyl)-s-triazine, 4-[m-chloro-p-N,N-di(ethoxycarbonyl methyl)aminophenyl]-2,6-di(trichloromethyl)-s-triazine, 4-[m-fluoro-p-N,N-di(ethoxycarbonylmethyl)aminophenyl]-2,6-di(trichloromethyl)-s-triazine, 4-[o-bromo-p-N,N-di(ethoxycarbonylmethyl)aminophenyl]-2,6-di(trichloromethyl)-s-triazine, 4-[o-chloro-p-N,N-di(ethoxycarbonylmethyl)aminophenyl]-2,6-di(trichloromethyl)-s-triazine, 4-[o-fluoro-p-N,N-di(ethoxycarbonylmethyl)aminophenyl]-2,6-di(trichloromethyl)-s-triazine, 4-[o-bromo-p-N,N-di(chloroethyl)aminophenyl]-2,6-di(trichloromethyl)-s-triazine, 4-[o-chloro-p-N,N-di(chloroethyl)aminophenyl]-2,6-di(trichloromethyl)-s-triazine, 4-[o-fluoro-p-N,N-di(chloroethyl)aminophenyl]-2,6-di(trichloromethyl)-s-triazine, 4-[m-bromo-p-N,N-di(chloroethyl)aminophenyl]-2,6-di(trichloromethyl)-s-triazine, 4-[m-chloro-p-N,N-di(chloroethyl)aminophenyl]-2,6-di(trichloromethyl)-s-triazine, 4-[m-fluoro-p-N,N-di(chloroethyl)aminophenyl]-2,6-di(trichloromethyl)-s-triazine, 4-(m-bromo-p-N-ethoxycarbonylmethyl aminophenyl)-2,6-di(trichloromethyl)-s-triazine, 4-(m-chloro-p-N-ethoxycarbonylmethyl aminophenyl)-2,6-di(trichloromethyl)-s-triazine, 4-(m-fluoro-p-N-ethoxycarbonylmethyl aminophenyl)-2,6-di(trichloromethyl)-s-triazine, 4-(o-bromo-p-N-ethoxycarbonylmethyl aminophenyl)-2,6-di(trichloromethyl)-s-triazine, 4-(o-chloro-p-N-ethoxycarbonylmethyl aminophenyl)-2,6-di(trichloromethyl)-s-triazine, 4-(o-fluoro-p-N-ethoxycarbonylmethyl aminophenyl)-2,6-di(trichloromethyl)-s-triazine, 4-(m-bromo-p-N-chloroethyl aminophenyl)-2,6-di(trichloromethyl)-s-triazine, 4-(m-chloro-p-N-chloroethyl aminophenyl)-2,6-di(trichloromethyl)-s-triazine, 4-(m-fluoro-p-N-chloroethyl aminophenyl)-2,6-di(trichloromethyl)-s-triazine, 4-(o-bromo-p-N-chloroethyl aminophenyl)-2,6-di(trichloromethyl)-s-triazine, 4-(o-chloro-p-N-chloroethyl aminophenyl)-2,6-di(trichloromethyl)-s-triazine, 4-(o-fluoro-p-N-chloroethyl aminophenyl)-2,6-di(trichloromethyl)-s-triazine.

In addition to these, the following compounds are desirably used: TAZ series manufactured by Midori Kagaku Co., Ltd. (for example, TAZ-107, TAZ-110, TAZ-104, TAZ-109, TAZ-140, TAZ-204, TAZ-113, and TAZ-123), T series manufactured by PANCHIM Co., Ltd. (for example, T-OMS, T-BMP, T-R, and T-B), Irgacure series manufactured by Ciba-Geigy, Corp. (for example, Irgacure 651, Irgacure 184, Irgacure 500, Irgacure 1000, Irgacure 149, Irgacure 819, and Irgacure 261), Darocur series (for example, Darocur 1173), 4,4'-bis(diethylamino)-benzophenone, 2-(O-benzoyloxime)-1-[4-(phenylthio)phenyl]-1,2-octane dion, 2-benzyl-2-dimethylamino-4-morpholinobutyrophenone, 2,2-dimethoxy-2- phenyl acetophenone, 2-(o-chlorophenyl)-4,5-diphenylimidazolyl dimer, 2-(o-fluorophenyl)-4,5-diphenylimidazolyl dimer, 2-(o-methoxyphenyl)-4,5-diphenylimidazolyl dimer, 2-(p-methoxyphenyl)-4,5-diphenylimidazolyl dimer, 2-(p-dimethoxyphenyl)-4,5-diphenylimidazolyl dimer, 2-(2,4-dimethoxyphenyl)-4,5-diphenylimidazolyl dimer, 2-(p-methylmercaptophenyl)-4,5-diphenylimidazolyl dimer and benzoin isopropyl ether.

These photo-polymerization initiator may be used in combination with a sensitizer and a photo-stabilizer. Specific examples of these include benzoin, benzoin methyl ether, 9-fluorenone, 2-chloro-9-fluorenone, 2-methyl-9-fluorenone, 9-anthrone, 2-bromo-9-anthrone, 2-ethyl-9-anthrone, 9,10-anthraquinone, 2-ethyl-9,10-anthraquinone, 2-t-butyl-9,10-anthraquinone, 2,6-dichloro-9,10-anthraquinone, xanthone, 2-methylxanthone, 2-methoxyxanthone, 2-ethoxyxanthone, thioxanthone, 2,4-diethylthioxanthone, acridone, 10-butyl-2-chloroacridone, benzyl, dibenzyl acetone, p-(dimethylamino)phenylstyryl ketone, p-(dimethylamino) phenyl-p-methylstyryl ketone, benzophenone, p-(dimethylamino) benzophenone (or Michler's ketone), p-(diethylamino)benzophenone, benzoanthrone, benzothiazole type compounds and the like described in JP-B No. 51-48516, Tinuvin 1130 and Tinuvin 400.

In addition to the above-mentioned photo-polymerization initiator, other known initiators may be used in the curable composition of the invention. Specific examples thereof include a vicinal polyketol aldonil compound disclosed in U.S. Pat. No. 2,367,660; an α-carbonyl compound disclosed in U.S. Pat. Nos. 2,367,661 and 2,367,670; acyloin ether disclosed in U.S. Pat. No. 2,448,828; an α-hydrocarbon-substituted aromatic acyloin compound disclosed in U.S. Pat. No. 2,722,512; a polynuclear quinone compound disclosed in U.S. Pat. Nos. 3,046,127 and 2,951,758, a combination of triallylimidazole dimer/p-aminophenyl ketone disclosed in U.S. Pat. No. 3,549,367; and benzothiazole type compound/trihalomethyl-s-triazine compound disclosed in JP-B No. 51-48516.

The amount of use of a photo-polymerization initiator is from 0.01 to 50% by mass, preferably from 1 to 30% by mass, and most preferably from 1 to 20% by mass, based on the solid content (mass) of the monomer which will be described later.

It is preferable to add a thermal polymerization inhibitor in addition to the above-mentioned components. Examples of the useful thermal polymerization inhibitor include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and 2-mercaptoberizoimidazole.

(Cross-Linking Agent)

The negative type color filter of the invention includes the above described azo dye represented by the formula (1) and can be preferably formed by, for example, coating the curable composition including the azo dye. According to the invention, a curing reaction of a coating film can be promoted to a higher degree than in the case of a conventional composition so as to obtain a film with excellent curability. Moreover, additional use of a crosslinking agent in the negative type color filter and the curable composition of the invention makes it possible to form a film that is cured to an even greater extent. The crosslinking agent will be explained below.

The crosslinking agent to be applied to the invention is not particularly limited as long as it carries out a film curing process through a crosslinking reaction. Examples thereof include (a) epoxy resin, (b) a melamine compound, a guanamine compound, a glycol uryl compound or an urea compound that is substituted by at least one substituent selected from the group consisting of a methylol group, an alkoxymethyl group and an acyloxymethyl group, and (c) a phenol compound, a naphthol compound or a hydroxyl anthracene that is substituted by at least one substituent selected from the group consisting of a methylol group, an alkoxymethyl group and an acyloxymethyl group. Among these, polyfunctional epoxy resin is preferably used.

As (a) epoxy resin, any resin may be used as long as it has an epoxy group and a crosslinking property. Examples thereof include divalent glycidyl group-containing low molecular compounds, such as bisphenol A diglycidyl ether, ethylene glycol diglycidyl ether, butane diol diglycidyl ether, hexane diol diglycidyl ether, dihydroxy biphenyl diglycidyl ether, phthalic acid diglycidyl ether and N,N-diglycidyl aniline; also trivalent glycidyl group-containing low molecular compounds, such as trimethylol propane triglycidyl ether, trimethylol phenol triglycidyl ether, Tris P-PA triglycidyl eter, also tetravalent glycidyl group-containing low molecular compounds, such as pentaerythritol tetraglycidyl ether and tetramethylol bisphenol A tetraglycidyl ether; also polyvalent glycidyl group-containing low molecular compounds, such as dipentaerythritol pentaglycidyl ether and dipentaerythritol hexa glycidyl ether; and also glycidyl group-containing polymer compounds, such as polyglycidyl(meth)acrylate and 1,2-epoxy-4-(2-oxyranyl)cyclohexane adduct of 2,2-bis(hydroxymethyl)-1-butanol.

The number of substituting methylol group, alkoxy methyl group and acyloxy methyl group in the crosslinking agent (b) is 2 to 6 in the case of a melamine compound, and 2 to 4 in the case of a glycol uryl compound, a guanamine compound and an urea compound. More preferably, it is 5 to 6 in the case of a melamine compound, and 3 to 4 in the case of a glycol uryl compound, a guanamine compound and an urea compound.

Hereinafter, the above-mentioned (b) melamine compound, guanamine compound, glycol uryl compound and urea compound may be also generally referred to as a compound related to (b) (methylol group-containing compound, alkoxy methyl group-containing compound or acyloxy methyl group-containing compound).

The abovementioned methylol group-containing compound related to (b) is obtained by heating the alkoxy methyl group-containing compound related to (b) in alcohol in the presence of an acidic catalyst such as hydrochloric acid, sulfuric acid, nitric acid and methane sulfonic acid. The abovementioned acyloxy methyl group-containing compound related to (b) is obtained by mixing and stirring the methylol group-containing compound related to (b) with acyl chloride in the presence of a basic catalyst.

Specific examples of compounds related to (b) having the above-mentioned substituent include the following.

Examples of the melamine compound include hexamethylol melamine, hexamethoxymethyl melamine and a compound in which 1 to 5 methylol groups of hexamethylol melamine are methoxy-methylated or mixtures thereof. Examples of the melamine compound also include hexamethoxy ethyl melamine, hexaacyloxy methyl melamine and a compound in which 1 to 5 methylol groups of hexamethylol melamine are acyloxy-methylated or mixtures thereof.

Examples of the above-mentioned guanamine compound include tetramethylol guanamine, tetramethoxy methyl guanamine and compounds in which 1 to 3 methylol groups of tetramethylol guanamine are methoxy-methylated or mixtures thereof, and tetramethoxy ethyl guanamine, tetraacyloxy methyl guanamine and compounds in which 1 to 3 methylol groups of tetramethylol guanamine are acyloxy-methylated or mixtures thereof.

Examples of the above-mentioned glycol uryl compound include tetramethylol glycol uryl, tetramethoxy methyl glycol uryl and compounds in which 1 to 3 methylol groups of tetramethylol glycol uryl are methoxy-methylated or mixtures thereof, and compounds in which 1 to 3 methylol groups of tetramethylol glycol uryl are acyloxy-methylated or mixtures thereof.

Examples of the above-mentioned urea compound include tetramethylol urea, tetramethoxy methyl urea and compounds in which 1 to 3 methylol groups of tetramethylol urea are methoxy-methylated or mixtures thereof, and tetramethoxy ethyl urea.

These compounds related to (b) may be used alone, or may be used in combination.

The above-mentioned crosslinking agent (c), that is, a phenol compound, a naphthol compound or a hydroxy anthracene compound which is substituted by at least one group selected from the group consisting of a methylol group, an alkoxy methyl group and an acyloxy methyl group, makes it possible to prevent inter-mixing with the uppercoat photoresist through thermal crosslinking, and also to further improve the film strength in the same manner as the above-mentioned crosslinking agent (b). Hereinafter, these compounds may be generally referred to as compounds related to (c) (methylol group-containing compound, alkoxy methyl group-containing compound or acyloxy methyl group-containing compound).

With respect to a number of the at least one group selected from a methylol group, an acyloxy methyl group, and an alkoxy methyl group contained in the above-mentioned crosslinking agent (c), two groups are required per molecule at a minimum. From the viewpoint of thermal crosslinking property and storage stability, it is preferable to use a compound in which all the second and fourth positions of the phenol skeleton are substituted. Moreover, in naphthol skeleton and hydroxy anthracene skeleton, it is preferable that all the ortho position and para position of the OH group are substituted. The third position and the fifth position of the phenol compound may be substituted or unsubstitued.

Regarding the above-mentioned naphthol compound, positions other than the ortho position of the OH group may be substituted or unsubstitued.

The methylol group-containing compound related to (c) is obtained from the reaction between a compound, in which ortho position or para position (second position or fourth position) of a phenolic OH group is a hydrogen atom, as a raw material and formalin in the presence of a basic catalyst, such as sodium hydroxide, potassium hydroxide, ammonia and tetraalkyl ammonium hydroxide.

The alkoxy methyl group-containing compound related to (c) is obtained by heating a methylol group-containing compound related to (c) in alcohol in the presence of an acidic catalyst such as hydrochloric acid, sulfuric acid, nitric acid, and methane sulfonic acid.

The acyloxy methyl group-containing compound related to (c) is obtained from the reaction of a methylol group-containing compound related to (c) with acyl chloride in the presence of a basic catalyst.

Examples of the skeleton compound in the crosslinking agent (c) include a phenol compound, naphthol and a hydroxy anthracene compound in which the ortho position or para position of the phenolic OH group is unsubstituted. Specific examples thereof include phenol, the isomers of cresol, 2,3-xylenol, 2,5-xylenol, 3,4-xylenol, 3,5-xylenol, bisphenols such as bisphenol A, 4,4'-bishydroxy biphenyl, Tris P-PA (manufactured by Honshu Chemical Industry Co., Ltd.), naphthol, dihydroxy naphthalene and 2,7-dihydroxy anthracene.

Examples of the crosslinking agent (c) include trimethylol phenol, tri(methoxymethyl)phenol and compounds in which 1 to 2 methylol groups of trimethylol phenol are methoxy-methylated, trimethylol-3-cresol, tri(methoxymethyl)-3-cresol, compounds in which 1 to 2 methylol groups of trimethylol-3-cresol are methoxy-methylated, dimethylol cresol such as 2,6-dimethylol-4-cresol, tetramethylol bisphenol A, tetramethoxy methyl bisphenol A, compounds in which 1 to 3 methylol groups of tetramethylol bisphenol A are methoxy-methylated, tetramethylol-4,4'-bishydroxy biphenyl, tetramethoxymethyl-4,4'-bishydroxy biphenyl, hexamethylol form of Tris P-PA, hexamethoxymethyl form of Tris P-PA, compounds in which 1 to 5 methylol groups of hexamethmethylol form of Tris P-PA are methoxy-methylated and bishydroxy methyl naphthalene diol.

Moreover, examples of the hydroxy anthracene compound include 1,6-dihydroxymethyl-2,7-dihydroxy anthracene, etc.

Furthermore, examples of the acyloxymethyl group-containing compound include compounds in which a part or all of the methylol groups of the methylol group-containing compound are acyloxy-methylated.

Among these compounds, preferable compounds are trimethylol phenol, bishydroxymethyl-p-cresol, tetramethylol bisphenol A, a hexamethylol form of Tris P-PA (manufactured by Honshu Chemical Industry Co., Ltd.) and phenol compounds in which methylol groups of these compounds are substituted by alkoxymethyl groups or methylol and alkoxymethyl groups.

These compounds related to (c) may be used alone or in combination.

In the invention, it is not always necessary to contain the above-mentioned crosslinking agent. When a crosslinking agent is contained, the total content of the crosslinking agents (a) to (c) in the curable composition is preferably 1 to 70% by mass, more preferably 5 to 50% by mass, and most preferably 7 to 30% by mass, based on the solid component (mass) of the curable composition, although it depends on the kind of material.

(Monomer)

The negative type color filter and the curable composition of the invention is preferable to contain at least one type of monomer. Hereinafter, the monomer will be described.

The above-mentioned monomer is preferably a compound having at least one addition-polymerizable ethylene group and having a boiling point of 100° C. or higher at a normal pressure. Examples of the monomers include monofunctional acrylates and methacrylates such as polyethyleneglycol mono(meth)acrylate, polypropyleneglycol mono(meth)acrylate, and phenoxyethyl(meth)acrylate; polyethyleneglycol di(meth)acrylate, trimethylolethane tri(meth)acrylate, neopentylglycol di(meth)acrylate, pentaerythritol tri(meth)acrylate, pentaerythritol tetra(meth)acrylate, dipentaerythritol penta(meth)acrylate, dipentaerythritol hexa(meth)acrylate, hexanediol (meth)acrylate, trimethylolpropane tri(acryloyloxypropyl)ether, tri(acryloyloxyethyl)isocyanurate, compounds obtained by adding ethylene oxide and propylene oxide to polyfunctional alcohols such as glycerin and trimethylolethane and then (meth)acrylating the obtained addition products; urethane acrylates described in JP-B Nos. 48-41708 and 50-6034 and JP-A No. 51-37193; polyester acrylates described in JP-A No. 48-64183 and JP-B Nos. 49-43191 and 52-30490; polyfunctional acrylates and methacrylates such as epoxyacrylates, which are reaction products of epoxy resins and (meth)acrylic acid; and mixtures of these compounds. Further, the examples may include photocurable monomers and oligomers described in Journal of Japanese Adhesive Association, vol. 20, No. 7, p. 300-308.

The content of the monomer in the curable composition is preferably 0.1 to 90% by mass, more preferably 1.0 to 80% by mass, and particularly preferably 2.0 to 70% by mass in the entire solid components of the composition.

(Organic Solvent)

At the time of producing the curable composition of the invention, an organic solvent (referred to as solvent in some cases in this specification) is generally added. Basically, the solvent is not particularly limited as long as it satisfies the solubility of the respective components and coatability of the curable composition and it is preferable to be selected in consideration of the solubility of a dye and a binder, coatability, and safety.

Preferable examples of the above-mentioned solvent include esters such as ethyl acetate, n-butyl acetate, isobutyl acetate, amyl formate, isoamyl acetate, isobutyl acetate, butyl propionate, isopropyl butyrate, ethyl butyrate, butyl butyrate, alkyl esters, methyl lactate, ethyl lactate, methyl oxyacetate, ethyl oxyacetate, butyl oxyacetate, methyl methoxyacetate, ethyl methoxyacetate, butyl methoxyacetate, methyl ethoxyacetate, and ethyl ethoxyacetate;

3-oxypropoionic acid alkyl esters such as methyl 3-oxypropoionate, ethyl 3-oxypropoionate, methyl 3-methoxypropionate, ethyl 3-methoxypropionate, methyl 3-ethoxypropionate, and ethyl 3-ethoxypropionate; 2-oxypropoionic acid alkyl esters such as methyl 2-oxypropoionate, ethyl 2-oxypropoionate, propyl 2-oxypropionate, methyl 2-methoxypropionate, ethyl 2-methoxypropionate, propyl 2-methoxypropionate, methyl 2-ethoxypropionate, ethyl 2-ethoxypropionate, methyl 2-oxy-2-methoxypropionate, ethyl 2-oxy-2-methoxypropionate, methyl 2-methoxy-2-methoxypropionate, and ethyl 2-ethoxy-2-methoxypropionate; methyl pyruvate, ethyl pyruvate, propyl pyruvate, methyl acetoacetate, ethyl acetoacetate, methyl 2-oxobutanate, and ethyl 2-oxobutanate;

ethers such as diethylene glycol dimethyl ether, tetrahydrofuran, ethylene glycol monomethyl ether, ethylene glycol monoethyl ether, methylcellosolve acetate, ethylcellosolve acetate, diethylene glycol monomethyl ether, diethylene glycol monoethyl ether, diethylene glycol monobutyl ether, propylene glycol methyl ether, propylene glycol methyl ether acetate, propylene glycol ethyl ether acetate, and propylene glycol propyl ether acetate;

ketones such as methyl ethyl ketone, cyclohexanone, 2-heptanone, and 3-heptanone; aromatic hydrocarbons such as toluene and xylene.

Among them, more preferable solvents include methyl 3-ethoxypropionate, ethyl 3-ethoxypropionate, ethylcellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether, and propylene glycol methyl ether acetate.

(Various Additives)

The curable composition of the invention, if necessary, may contain various additives such as a filler, a polymer compound other than polymers mentioned above, a surfactant, an adhesion promoting agent, an anti-oxidant, an UV absorbent, an agglomeration preventing agent and the like.

Specific examples of these additives are a filler such as glass and alumina; polymer compound such as poly(vinyl alcohol), poly(acrylic acid), polyethylene glycol monoalkyl ether, and polyfluoroalkyl acrylate other than a binder resin; nonionic, cationic, and anionic surfactants; an adhesion promoting agent such as vinyltrimethoxysilane, vinyltriethoxysilane, vinyltris(2-methoxyethoxy)silane, N-(2-aminoethyl)-3-aminopropylmethyldimethoxysilane, N-(2-aminoethyl)3-aminopropyltrimethoxylsilane, 3-aminopropyltriethoxysilane, 3-glycidoxypropyltrimethoxysilane, 3-glycidoxypropylmethyldimethoxysilane, 2-(3,4-epoxycyclohexyl)ethyltrimethoxylsilane, 3-chloropropylmethyldimethoxysilane, 3-chloropropyltrimethoxysilane, 3-methacryloxypropyltrimethoxysilane, and 3-mercaptopropyltrimethoxysilae; an anti-oxidants such as 2,2-thiobis(4-methyl-6-tert-butylphenol), and 2,6-di-tert-butylphenol; an UV absorbents such as 2-(3-tert-butyl-5-methyl-2-hydroxyphenyl)-5-chlorobenzotriazole and alkoxybenzophenone; and agglomeration preventing agents such as sodium polyacrylate.

Further, an organic carboxylic acid, preferably a low molecular weight organic carboxylic acid having a molecular weight of 1,000 or less, can be added to the curable composition of the invention for the purpose of accelerating dissolution of the non-image portion to alkali and further improving the developing property of the curable composition.

Specific examples of the organic carboxylic acid include aliphatic monocarboxylic acids such as formic acid, acetic acid, propionic acid, butyric acid, valeric acid, pivalic acid, caproic acid, diethyl acetate, enanthic acid and capric acid; aliphatic dicarboxylic acids such as oxalic acid, malonic acid, succinic acid, glutaric acid, adipic acid, pimellic acid, suberic acid, azelaic acid, sebacic acid, brassylic acid, methylmalonic acid, ethylmalonic acid, dimethylmalonic acid, methylsuccinic acid, tetramethylsuccinic acid, and citraconic acid; aliphatic tricarboxylic acids such as tricarballylic acid, aconitic acid, and camphoronic acid; aromatic monocarboxylic acids such as benzoic acid, toluic acid, cuminic acid, hemellitic acid, and mesitylenic acid; aromatic polycarboxylic acids such as phthalic acid, isophthalic acid, terephthalic acid, trimellitic acid, trimesitylenic acid, mellophanic acid, and pyromellitic acid; other carboxylic acids such as phenyl acetate, hydratropic acid, hydrocinnamic acid, mandelic acid, phenylsuccinic acid, atropic acid, cinnamic acid, methyl cinnamate, benzyl cinnamate, cinnamylideneacetic acid, coumaric acid, and umbellic acid.

(Support)

Examples of the support contained in the negative type color filter of the invention include soda glass, Pyrex (R) glass, quartz glass, and these glasses having a transparent conductive film bonded thereon, which may be used in liquid crystal display devices and the like. Examples of the support also include photoelectric conversion device substrates used for image pickup devices and the like, for instance, silicon substrates, complementary metal oxide film semiconductors (CMOS) and the like. In some cases such a support may have thereon a black stripe that is used for separating each pixel. Moreover, an undercoat layer may be formed on the support, if necessary, in order to improve the adhesion with an upper layer, to prevent substance dispersion or to flatten the substrate surface.

The negative type color filter of the invention can be preferably obtained, for example, by coating the support with a curable composition prepared as a negative type by using the azo dye represented by the formula (1), by exposing the support to light through a mask and by developing to form a pattern image as aforementioned. When a negative type color filter having desired hues is produced in the method of producing the above negative type color filter, the above step is carried out repeatedly in accordance with the number of desired hues. Also, an embodiment having the step of curing the aforementioned pattern image by heating and/or exposure to light is preferable according to need.

As the developer used in this case, any developer having a composition which dissolves the uncured part of the curable composition but does not dissolve the cured part may be used.

Specific examples thereof include various kinds of combinations of organic solvents, and alkaline aqueous solutions. The above-mentioned aqueous alkaline solution may be prepared by dissolving alkaline compounds such as sodium hydroxide, potassium hydroxide, sodium carbonate, sodium silicate, sodium metasilicate, aqueous ammonia, ethylamine, diethylamine, dimethylethanolamine, tetramethylammonium hydroxide, tetraethylammonium hydroxide, choline, pyrrole, piperidine, and 1,8-diazabicyclo[5,4,0]-7-undecene. These alkaline compounds are preferably dissolved at a concentration of 0.001 to 10% by mass, and more preferably 0.01 to 1% by mass. When a developer comprising such an alkaline aqueous solution is used, the color filter is, in general, washed with water after development.

A negative type color filter of the invention can be used for liquid crystal display devices (LCD) and solid state image pickup devices such as CCD and CMOS, and particularly suitable for CCD devices and CMOS devices having 1,000,000 or more pixels with high image resolution. The negative type color filter of the invention may be used as a color filter to be installed between a light reception unit of each pixel composing a CCD and a microlens for condensing light.

EXAMPLES

The present invention will be hereinafter explained in detail by way of examples, which, however, are not intended to be limiting of the invention. In these examples shown below, all designations of "parts" indicate "parts by mass", unless otherwise noted.

Example 1

| 1) Preparation of a resist solution | |
| --- | --- |
| Propylene glycol monomethyl ether acetate (PGMEA) | 19.20 parts |
| Ethyl lactate | 36.67 parts |
| Binder (41% PGMEA solution of benzylmethacrylate/methacrylic acid/2-hydroxyethylmethacrylate copolymer (molar ratio = 60:20:20)) | 30.51 parts |
| Dipentaerythritol hexaacrylate (photopolymerizable compound) | 12.20 parts |
| Polymerization inhibitor (p-methoxyphenol) | 0.0061 parts |
| Fluorine type surfactant (F-475, manufactured by Dainippon Ink and Chemicals, Incorporated) | 0.83 parts |
| Photopolymerization initiator (TAZ-107 (trihalomethyltriazine type photopolymerization initiator), manufactured by Midori Kagaku Co., Ltd.) | 0.586 parts |

The above components were mixed to prepare a resist solution.

2) Production of a Glass Substrate with an Undercoat Layer

A glass substrate (Corning 1737) was cleaned ultrasonically using an aqueous 1% NaOH solution, followed by washing with water and dehydration-baking (200° C./30 minutes). Then, the resist solution obtained in the above 1) was applied to the cleaned glass substrate in a film thickness of 2 μm by using a spin coater and dried at 220° C. for one hour to form a cured film (undercoat layer).

3) Preparation of a Dye Resist Solution 100 parts of the resist solution obtained in the above 1) was mixed with 8 parts of the dye a-16 (the above exemplified compound which was an azo dye represented by the formula (1)) to dissolve the dye thereby obtaining a dye resist solution (a solution of a curable composition).

4) Exposure and Development of the Curable Composition (Image Forming Step)

The dye resist solution obtained in the above 3) was applied to the undercoat layer of the glass substrate with an undercoat layer obtained in the above 2) in a film thickness of 2.0 μm by using a spin coater and prebaked at 120° C. for 120 seconds. Then, using an exposure apparatus, the coating film was irradiated with light having a wavelength of 365 nm at a dose of 800 mJ/cm$^2$ through a mask with a pattern of 20 μm line width. After the substrate was irradiated, it was developed using a developer (60% CD-2000, manufactured by Fujifilm Archi Co., Ltd.) at 26° C. for 60 seconds. Then, the substrate was rinsed using water stream for 20 seconds, followed by spray-drying to form a magenta pattern image thereby obtaining a negative type color filter. The formation of an image was confirmed using a usual method using an optical microscope and by SEM photographic observation.

5) Evaluation

The color filter obtained above was evaluated as to the following characteristics. The results of the evaluation are shown in Table 1 shown below.

(1) Light Fastness

The color filter provided with a pattern image formed in the above manner was irradiated with light in an exposure amount of 1000000 lux·h by using Sun Tester XF-180CPS (manufactured by Shimadzu Corporation) as a light source. The dye residual rate [%] (the rate of the amount of the dye after the substrate was irradiated with light to that before the substrate was irradiated with light) at the maximum absorption wavelength $\lambda_{max}$ of the color filter was found as an index used when evaluating the light fastness.

(2) Heat Resistance

The color filter provided with a pattern image formed in the above manner was heated at 200° C. for 60 minutes and then, the dye residual rate [%] (the rate of the amount of the dye after the color filter was heated to that before the color filter was heated) was found as an index used when evaluating the heat resistance.

TABLE 1

| | Dye (*1) | Light fastness (dye residual rate: %) | Heat resistance (dye residual rate: %) |
| --- | --- | --- | --- |
| Example 1 | a-16 | 98 | 99 |
| Example 2 | f-8 | 99 | 96 |
| Example 3 | f-9 | 97 | 98 |
| Example 4 | f-19 | 99 | 99 |
| Example 5 | f-21 | 98 | 99 |
| Comparative Example 1 | D-1 | 87 | 78 |

(*1): The symbols described in the column of the dye in Examples show the number of the exemplified compound of the azo dye represented by the formula (1)

Examples 2 to 5

A dye resist solution was prepared so as to obtain the same film absorbance as in the case of Example 1 and further a color filter provided with a magenta pattern image was manufactured in the same manner as in Example 1 except that the azo dye used in "3) Preparation of a dye resist solution" was altered to each dye (azo dyes represented by the formula (1) or (2)) shown in the foregoing Table 1 in Example 1 and also the same evaluation was made.

Comparative Example 1

A dye resist solution was prepared so as to obtain the same film absorbance as in the case of Example 1 and further a color filter provided with a magenta pattern image was manufactured in the same manner as in Example 1 except that the azo dye used in "3) Preparation of a dye resist solution" was altered to the following dye D-1 in Example 1 and also the same evaluation was made.

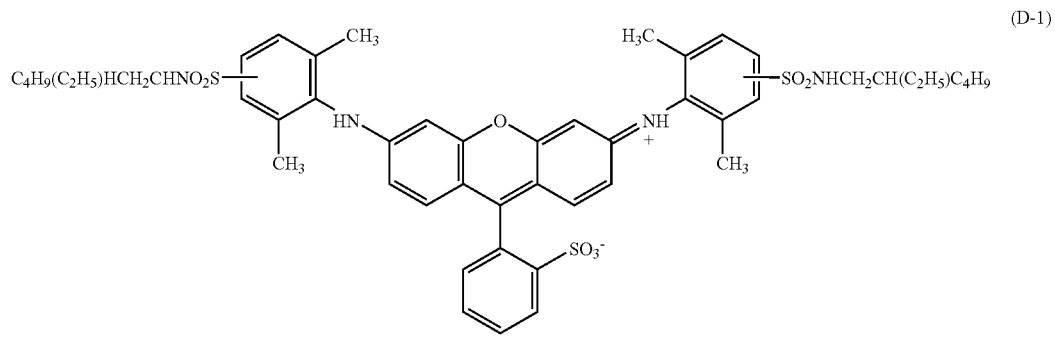

(D-1)

As shown in the foregoing Table 1, the color filters of Examples using dyes according to the invention had high durability to light and heat. Also, since the absorption spectrum of the curable composition used to form a pattern image was superior in the decrease of absorbance in the long wavelength side, it was possible to manufacture a color filter having absorption characteristics superior in color reproducibility as the hue of three primary colors. On the other hand, the color filter of Comparative Example using a dye other than the dyes according to the invention failed to obtain satisfactory durability to light and heat.

Example 6

| 1) Preparation of a resist solution | |
|---|---|
| Propylene glycol monomethyl ether acetate (PGMEA) | 5.20 parts |
| Ethyl lactate (EL) | 52.6 parts |
| Binder (41% EL solution of benzylmethacrylate/methacrylic acid/2-hydroxyethylmethacrylate copolymer (copolymer ratio (molar ratio) = 60:20:20)) | 30.5 parts |
| Dipentaerythritol hexaacrylate | 10.2 parts |
| Polymerization inhibitor (p-methoxyphenol) | 0.006 parts |
| Fluorine type surfactant | 0.80 parts |
| TAZ-107 (photopolymerization initiator, manufactured by Midori Kagaku Co., Ltd.) | 0.58 parts |

The above components were mixed to prepare a resist solution.

2) Production of a Glass Substrate with an Undercoat Layer

A glass substrate (Corning 1737) was cleaned ultrasonically using an aqueous 0.5% NaOH solution, followed by washing with water and dehydration-baking (200° C./20 minutes). Then, the resist solution obtained in the above 1) was applied to the cleaned glass substrate in a film thickness of 2 μm by using a spin coater and dried at 220° C. for one hour to form a cured film (undercoat layer).

3) Preparation of a Dye Resist Solution (Color Curable Composition (Negative Type))

9.4 g of the resist solution obtained in the above 1) was mixed with 0.75 g of the aforementioned exemplified compound g-1 which was the dye according to the invention (the dye represented by the formula (1)) to dissolve the dye thereby obtaining a dye resist solution (a solution of a color curable composition (negative type)).

4) Exposure and Development of the Dye Resist Solution (Image Formation)

The dye resist solution obtained in the above 3) was applied to the undercoat layer of the glass substrate with an undercoat layer obtained in the above 2) in a film thickness of 1.0 μm by using a spin coater and prebaked at 100° C. for 120 seconds.

Then, using an exposure apparatus, the coating film was exposed to light having a wavelength of 365 nm at a dose of 500 mJ/cm² through a mask with a pattern of 20 μm line width. After the substrate was irradiated, it was developed using a developer (CD-2000, manufactured by Fujifilm Archi Co., Ltd.) at 25° C. for 40 seconds. Then, the substrate was rinsed using water stream for 30 seconds, followed by spray-drying.

A yellow pattern preferable as a yellow color constituting a color filter was thus obtained.

5) Evaluation

The storage stability of the prepared dye resist solution over time and the heat resistance and light fastness of the coating film formed on the glass substrate by applying the dye resist solution were evaluated in the following manner. The results of evaluation are shown in Table 2 below.

-Storage Stability Over Time-

After the dye resist solution was stored at ambient temperature for one month, the degree of the precipitation of foreign materials in the solution was visually evaluated according to the following criterion.

(Criterion)

◯: No precipitation was found.

Δ: Precipitation was found a little.

X: Precipitation was found.

-Heat Resistance-

The glass substrate coated with the dye resist solution was placed on a 200° C. hot plate such that the surface of the glass substrate was in contact with the plate and heated for one hour. Then, a difference (ΔEab value) in color before and after heating was measured using a chromaticity meter MCPD-1000 (manufactured by Otsuka Electronic Co., Ltd.) as an index for evaluating the heat resistance to evaluate the heat resistance according to the following criterion. The smaller the ΔEab value is, the better the heat resistance is shown to be.

(Criterion)
○: ΔEab value<5
Δ: 5≦ΔEab value≦10
X: ΔEab value>10

(1) Light Fastness

The glass substrate coated with a dye resist solution was irradiated with light from a xenon lamp at an intensity of 50000 lux for 20 hours (corresponding to 1000000 lux·h). Then, a difference (ΔEab value) in color before and after irradiation was measured as an index for evaluating the light fastness to evaluate the light fastness according to the following criterion. The smaller the ΔEab value is, the better the light fastness is shown to be.

(Criterion)
○: ΔEab value<3
Δ: 3≦ΔEab value≦10
X: ΔEab value>10

Examples 7 to 15

A yellow pattern was formed in the same manner as in Example 6 except that the dye according to the invention was altered (but equivalent mol) to those shown in Table 2 below in "3) Preparation of a dye resist solution" in Example 6 and also the same evaluation was made. The results of evaluation are shown in Table 2 below.

Comparative Examples 2 and 3

A yellow pattern for comparison was formed in the same manner as in Example 6 except that the dye according to the invention was altered (but equivalent mol) to those shown in Table 2 below in "3) Preparation of a dye resist solution" in Example 6 and also the same evaluation was made. The results of evaluation are shown together with the results of Examples in Table 2 below.

TABLE 2

| | Dye (*1) | storage stability | Heat resistance | Light fastness |
|---|---|---|---|---|
| Example 6 | g-1 | ○ | ○ | ○ |
| Example 7 | g-9 | ○ | ○ | ○ |
| Example 8 | g-12 | ○ | ○ | ○ |
| Example 9 | g-20 | ○ | ○ | ○ |
| Example 10 | g-25 | Δ | ○ | ○ |
| Example 11 | g-28 | ○ | ○ | Δ |
| Example 12 | g-30 | ○ | Δ | ○ |
| Example 13 | g-34 | Δ | ○ | Δ |
| Example 14 | g-41 | Δ | ○ | Δ |
| Example 15 | g-48 | Δ | Δ | Δ |
| Comparative Example 2 | CI Solvent Yellow 162 | X | X | X |
| Comparative Example 3 | CI Solvent Yellow 82 | X | X | X |

(*1): The symbols described in the column of the dye in Examples show the number of the exemplified compound of the azo dye represented by the formula (1).

As shown in Table 2, the color curable compositions prepared in a solution state in the examples using the dye according to the invention were all superior in storage stability to the comparative examples using dyes other than the dyes according to the invention. Also, the yellow patterns formed using this color curable compositions exhibited high heat resistance and light fastness.

Examples 16 to 25

The same procedures as in Examples 6 to 15 were conducted except that each glass substrate in Examples 6 to 15 was altered to a silicon wafer substrate, to form a coating film on the silicon wafer substrate. Then, the coating film was exposed to a 2 by 2 μm square pattern in an exposure amount of 500 mj/cm² by using an i-ray reduction projection exposure apparatus and then developed using a developer prepared by diluting CD-2000 (manufactured by Fuji Film Archi Co., Ltd.) at a dilution of 60% at 23° C. for 60 seconds. Thereafter, the substrate was rinsed by water stream for 30 seconds and spray-dried. The above process made it possible to obtain a pattern suitable to a CCD color filter in which pattern the section of the square was substantially rectangular and which had a good profile.

The invention can provide a negative type color filter which is superior in a hue (color reproducibility), light durability and heat durability, a method of producing the negative type color filter and a curable composition preferable to form, for example, a color image (especially, a negative type color filter) superior in light durability and heat durability.

What is claimed is:

1. A negative type color filter obtained by using a curable composition comprising a compound represented by the following formula (2), a monomer having an ethylenically unsaturated group, a binder, and a photopolymerization initiator:

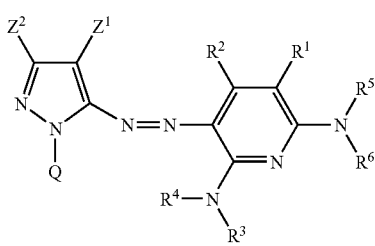

Formula (2)

wherein $Z^1$ is a cyano group; $Z^2$ represents a hydrogen atom, an aliphatic group, an aromatic group or a heterocyclic group, $R^1$ and $R^2$ each independently represent a hydrogen atom, a halogen atom, an aliphatic group, an aromatic group, a heterocyclic group, a cyano group, a carboxyl group, a carbamoyl group, an alkoxycarbonyl group, an aryloxycarbonyl group, an acyl group, a hydroxy group, an alkoxy group, an aryloxy group, a silyloxy group, an acyloxy group, a carbamoyloxy group, a heterocyclic oxy group, an alkoxycarbonyloxy group, an aryloxycarbonyloxy group, an amino group substituted with an alkyl group, aryl group or heterocyclic group, an acylamino group, a ureide group, a sulfamoylamino group, an alkoxycarbonylamino group, an aryloxycarbonylamino group, an alkylsulfonylamino group, an arylsulfonylamino group, an aryloxycarbonylamino group, a nitro group, an alkylthio group, an arylthio group, an alkylsulfonyl group, an arylsulfonyl group, an alkylsulfinyl group, an arylsulfinyl group, a sulfamoyl group, a sulfo group or a heterocyclic thio group; $R^3$ and $R^4$ each independently represent a hydrogen atom, an aliphatic group, an aromatic group, a heterocyclic group, an acyl group, an alkoxycarbonyl group, an aryloxycarbonyl group, a carbamoyl group, a sulfonyl group or a sulfamoyl group; $R^5$ and $R^6$ each independently represent a hydrogen atom, an aliphatic group, an aromatic group, a heterocyclic group, an acyl group, an alkoxycarbonyl group, an aryloxycarbonyl group, a carbamoyl group, an alkylsulfonyl group, an arylsulfonyl group or a sulfamoyl group provided that R⁵ and R⁶ do not both represent hydrogen atoms at the same time; R¹ and R⁵, and/or R⁵ and R⁶ may be bonded with each other to form a five-membered or six-membered ring; and Q represents a hydrogen atom, an aliphatic group, an aromatic group or a heterocyclic group.

2. The negative type color filter according to claim 1, wherein R³ and R⁴ in the formula (2) are each independently one selected from the group consisting of a hydrogen atom, an aromatic group, a heterocyclic group, an acyl group, an alkylsulfonyl group or an arylsulfonyl group.

3. The negative type color filter according to claim 1, wherein the monomer having an ethylenically unsaturated group has a boiling point of 100° C. or higher at a normal pressure.

4. The negative type color filter according to claim 1, wherein the photopolymerization initiator is an oxime compound.

5. The negative type color filter according to claim 1, wherein the binder is a linear organic high molecular weight polymer.

6. The negative type color filter according to claim 1, wherein the binder is an acrylic resin.

7. The negative type color filter according to claim 1, wherein the curable composition further comprises a fluorine type surfactant.

8. The negative type color filter according to claim 1, wherein the curable composition further comprises a crosslinking agent.

9. The negative type color filter according to claim 1, wherein the photopolymerization initiator contained in the curable composition consists essentially of one or more trihalomethyltriazine compounds.

10. A method of producing a negative type color filter, the method comprising:
    applying a curable composition to a support,
    exposing the curable composition to light through a mask, and
    developing the curable composition to form a pattern image,
    wherein the curable composition comprises a compound represented by the following formula (2), a monomer having an ethylenically unsaturated group, a binder, and a photopolymerization initiator:

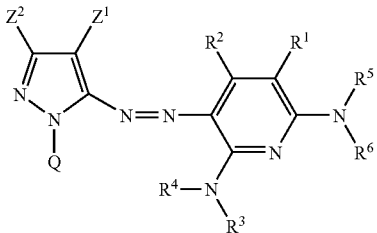

Formula (2)

wherein $Z^1$ is a cyano group; $Z^2$ represents a hydrogen atom, an aliphatic group, an aromatic group or a heterocyclic group, $R^1$ and $R^2$ each independently represent a hydrogen atom, a halogen atom, an aliphatic group, an aromatic group, a heterocyclic group, a cyano group, a carboxyl group, a carbamoyl group, an alkoxycarbonyl group, an aryloxycarbonyl group, an acyl group, a hydroxy group, an alkoxy group, an aryloxy group, a silyloxy group, an acyloxy group, a carbamoyloxy group, a heterocyclic oxy group, an alkoxycarbonyloxy group, an aryloxycarbonyloxy group, an amino group substituted with an alkyl group, aryl group or heterocyclic group, an acylamino group, a ureide group, a sulfamoylamino group, an alkoxycarbonylamino group, an aryloxycarbonylamino group, an alkylsulfonylamino group, an arylsulfonylamino group, an aryloxycarbonylamino group, a nitro group, an alkylthio group, an arylthio group, an alkylsulfonyl group, an arylsulfonyl group, an alkylsulfinyl group, an arylsulfinyl group, a sulfamoyl group, a sulfo group or a heterocyclic thio group; $R^3$ and $R^4$ each independently represent a hydrogen atom, an aliphatic group, an aromatic group, a heterocyclic group, an acyl group, an alkoxycarbonyl group, an aryloxycarbonyl group, a carbamoyl group, a sulfonyl group or a sulfamoyl group; $R^5$ and $R^6$ each independently represent a hydrogen atom, an aliphatic group, an aromatic group, a heterocyclic group, an acyl group, an alkoxycarbonyl group, an aryloxycarbonyl group, a carbamoyl group, an alkylsulfonyl group, an arylsulfonyl group or a sulfamoyl group provided that $R^5$ and $R^6$ do not both represent hydrogen atoms at the same time; $R^1$ and $R^5$, and/or $R^5$ and $R^6$ may be bonded with each other to form a five-membered or six-membered ring; and Q represents a hydrogen atom, an aliphatic group, an aromatic group or a heterocyclic group.

11. The method of producing a negative type color filter according to claim 10, wherein the monomer having an ethylenically unsaturated group has a boiling point of 100° C. or higher at a normal pressure.

12. The method of producing a negative type color filter according to claim 10, wherein the photopolymerization initiator is an oxime compound.

13. The method of producing a negative type color filter according to claim 10, wherein the binder is a linear organic high molecular weight polymer.

14. The method of producing a negative type color filter according to claim 10, wherein the binder is an acrylic resin.

15. The method of producing a negative type color filter according to claim 10, wherein the curable composition further comprises a fluorine type surfactant.

16. The method of producing a negative type color filter according to claim 10, wherein the curable composition further comprises a crosslinking agent.

17. The method of producing a negative type color filter according to claim 10, wherein the photopolymerization initiator contained in the curable composition consists essentially of one or more trihalomethyltriazine compounds.

* * * * *